(12) United States Patent
Glovatsky et al.

(10) Patent No.: US 6,501,031 B1
(45) Date of Patent: Dec. 31, 2002

(54) ELECTRICAL CIRCUIT BOARD AND A METHOD FOR MAKING THE SAME

(75) Inventors: Andrew Z. Glovatsky, Livonia, MI (US); Jay D. Baker, Dearborn, MI (US); Robert Edward Belke, West Bloomfield, MI (US); Myron Lemecha, Dearborn Heights, MI (US); Richard Keith McMillan, Dearborn, MI (US); Thomas B. Krautheim, Belleville, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/655,809

(22) Filed: Sep. 6, 2000

(51) Int. Cl.[7] .................................................. H05K 1/11
(52) U.S. Cl. ........................... 174/262; 29/846; 29/832; 29/852; 29/856
(58) Field of Search ................................. 174/252, 262, 174/263, 264, 265, 266; 29/832, 836, 846, 852, 856

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 5,738,797 A | | 4/1998 | Belke, Jr. et al. |
| 5,914,859 A | * | 6/1999 | Takada et al. ............... 361/704 |
| 5,917,157 A | * | 6/1999 | Remsburg .................... 174/252 |
| 6,157,538 A | * | 12/2000 | Ali et al. ..................... 361/704 |
| 6,310,303 B1 | * | 10/2001 | Luvara et al. ............... 174/261 |

* cited by examiner

Primary Examiner—Albert W. Paladini
Assistant Examiner—José H. Alcala
(74) Attorney, Agent, or Firm—Visteon Global Tech., Inc.

(57) ABSTRACT

A multi-layer electronic circuit board design 10 having a core member 12, a pair of dielectric layers 14, 16 disposed thereon, and a first circuit portion 20 which is coupled to the dielectric layer 14 and core member 12 using a layer of adhesive material 18. Circuit board design 10 further having selectively formed "blind" apertures, vias or cavities 22 formed through the first circuit portion 20, dielectric layer 14, and adhesive layer 18, thereby exposing core member 12.

28 Claims, 15 Drawing Sheets

ELECTRICAL CIRCUIT BOARD AND A METHOD FOR MAKING THE SAME

FIELD OF THE INVENTION

The present invention relates to a method for making an electrical circuit board and more particularly, to a method for making a multi-layer electrical circuit board having multiple circuit interconnections and having apertures and/or cavities which are formed within the circuit board and/or through various portions of the circuit board.

BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires one or more holes or cavities to be drilled and/or formed through the core of the circuit board substrate, thereby selectively creating one or more "through-hole" type vias (i.e., holes which pass and/or traverse the entire circuit board or all of the opposed component containing surfaces). The "through-hole" type vias are then typically filled with solder (e.g., a pin or component connector is soldered into the hole). In this manner, electrical connections are made or formed which connect electrical components and/or circuitry to the core of the circuit board substrate, or to other components and/or circuitry located on the opposing side or surface of the board.

One drawback with these "through-hole" type vias is that layers of relatively non-solderable material (i.e., material which does not substantially bind or metallurgically bond with solder) are typically present within these vias, and thus, the solder does not consistently and reliably electrically connect the desired layers of circuitry and/or components together. Additionally, the drilling required to form these "through hole" type vias is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, these attempts have not produced reliable electrical interconnections and the produced interconnections are not typically adapted to allow for communication of electrical power signals by and between the board surfaces and/or the interior component containing portions.

For these reasons, "blind" type vias, apertures or cavities (i.e., holes which do not pass and/or traverse an entire circuit board or all of the opposed component containing surfaces) have been developed and utilized to make and/or form connections between portions and/or layers of a circuit board. The present application describes new and novel designs for such "blind" type vias or cavities, which selectively allow for the interconnection of one or more layers of electrical circuitry.

SUMMARY OF THE INVENTION

It is a first object of the present invention to provide a method for producing a multi-layer electrical circuit board, which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques and which allows for the selective, efficient, and reliable formation of apertures which allow for communication by and between some or all of the various component containing surfaces and portions of the formed multi-layer electrical circuit board, which selectively allows components contained within and/or upon these portions and surfaces to be interconnected, and which is further adapted to selectively and communicatively receive an electrical component and/or an electrical component connector portion.

According to a first aspect of the present invention, a circuit board assembly is provided. The circuit board assembly includes an electrically conductive core member; first circuit portion connected to the core member; and an annular ring which is integrally formed within the first circuit portion and which forms a blind via within the circuit board assembly which extends to the core member.

According to a second aspect of the present invention, a second circuit board assembly is provided. The circuit board assembly includes a pre-circuit assembly having a core metal portion and a first and second electrically conductive member, a core electrically conductive member contained between a first layer of dielectric material and a second layer of dielectric material, the core member connected to the pre-circuit assembly by a first layer of adhesive and a third electrically conductive member connected to the core member by a second layer of adhesive, wherein certain portions of the core member, the third electrically conductive member, the adhesive layers and the dielectric material layers have been removed to form a blind via and an annular pad which surrounds the blind via.

According to a third aspect of the present invention, a method for making a circuit board is described. The method includes the steps of providing a core member having a first surface and a second surface; selectively applying a first certain dielectric material to the first surface of the core member; selectively applying a first adhesive material to certain selective portions of the first dielectric material; attaching a first electrically conductive member to the first surface of the core member using the adhesive material; and removing certain selective portions of the first electrically conductive member, the first dielectric material and the first adhesive material effective to cooperatively form a blind via.

These and other objects, aspects, and advantages of the present invention will become apparent upon reading the following detailed description in combination with the accompanying drawings.

BRIEF DESCRIPTION OF THE DRAWINGS

FIGS. 1b and 1c are top views illustrating non-limiting embodiments of the the blind via or cavity shown in FIG. 1a;

FIGS. 2b and 2c are top views illustrating non-limiting embodiments of the blind via or cavity shown in FIG. 2a;

FIGS. 3b and 3c are top views illustrating non-limiting embodiments of the blind via or cavity shown in FIG. 3a;

FIGS. 4b and 4c are top views illustrating non-limiting embodiments of the blind via or cavity shown in FIG. 4a;

FIGS. 5b and 5c are top views illustrating non-limiting embodiments of the blind via or cavity shown in FIG. 5a;

FIGS. 6b and 6c are top views illustrating non-limiting embodiments of the blind via or cavity shown in FIG. 6a;

FIGS. 7b, 7c and 7d are top views illustrating non-limiting embodiments of the blind via or cavity shown in FIG. 7a;

FIGS. 8b and 8c are top views illustrating non-limiting embodiments of the blind via or cavity shown in FIG. 8a;

FIGS. 9b and 9c are top views illustrating non-limiting embodiments of the blind via or cavity shown in FIG. 9a;

FIGS. 10b and 10c are top views illustrating non-limiting embodiments of the blind via or cavity shown in FIG. 10a;

FIGS. 11b and 11c are top views illustrating non-limiting embodiments of the blind via or cavity shown in FIG. 11a;

FIGS. 12b and 12c are top views illustrating non-limiting embodiments of the blind via or cavity shown in FIG. 12a;

FIGS. 13b and 13c are top views illustrating non-limiting embodiments of the blind via or cavity shown in FIG. 13a;

FIGS. 14b and 14c are top views illustrating non-limiting embodiments of the blind via or cavity shown in FIG. 14a;

FIGS. 15b and 15c are top views illustrating non-limiting embodiments of the blind via or cavity shown in FIG. 15a;

FIGS. 16b and 16c are top views illustrating non-limiting embodiments of the blind via or cavity shown in FIG. 16a;

FIG. 17a is a sectional side view of a multi-layer circuit board including a "blind" via or cavity which is formed in accordance with the teachings of a seventeenth embodiment of the invention;

FIGS. 17b and 17c are top views illustrating non-limiting embodiments of the blind via or cavity shown in FIG. 17a;

FIG. 18a is a sectional side view of a multi-layer circuit board including a "blind" via or cavity which is formed in accordance with the teachings of a eighteenth embodiment of the invention;

FIGS. 18b and 18c are top views illustrating non-limiting embodiments of the blind via or cavity shown in FIG. 18a;

FIGS. 19b and 19c are top illustrating non-limiting embodiments of the blind via or cavity shown in FIG. 19a;

FIGS. 20b and 20c are top views illustrating non-limiting embodiments of the blind via or cavity shown in FIG. 20a;

FIGS. 21b and 21c are top views illustrating non-limiting embodiments of the blind via or cavity shown in FIG. 21a;

FIGS. 22b and 22c are top views illustrating non-limiting embodiments of the blind via or cavity shown in FIG. 22a;

FIGS. 23b and 23c are views illustrating non-limiting embodiments of the blind via or cavity shown in FIG. 23a;

FIGS. 24b and 24c are top views illustrating non-limiting embodiments of the blind via or cavity shown in FIG. 24a;

FIGS. 25b and 25c are top views illustrating non-limiting embodiments of the blind via or cavity shown in FIG. 25a;

FIGS. 26b, 26c and 26d are top views illustrating non-limiting embodiments of the blind via or cavity shown in FIG. 26a;

FIGS. 27b and 27c are top views illustrating non-limiting embodiments of the blind via or cavity shown in FIG. 27a;

FIGS. 28b and 28c are top views illustrating non-limiting embodiments of the blind via or cavity shown in FIG. 28a;

FIGS. 29b and 29c are top views illustrating non-limiting embodiments of the blind via or cavity shown in FIG. 29a;

FIGS. 30b, 30c and 30d are top views illustrating non-limiting embodiments of the blind via or cavity shown in FIG. 30a.

DETAILED DESCRIPTION OF THE PREFERRED EMBODIMENT OF THE INVENTION

Figure 1A:
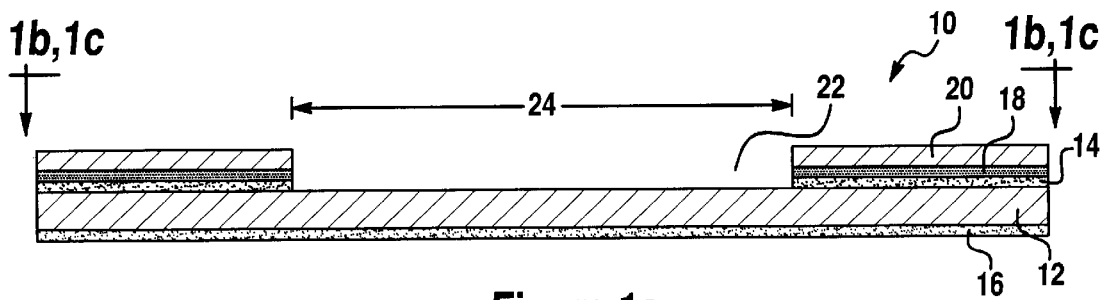
FIG. 1a is a sectional side view of a multi-layer circuit board including a "blind" via or cavity which is formed in accordance with the teachings of a first embodiment of the invention.
Figure 1B:
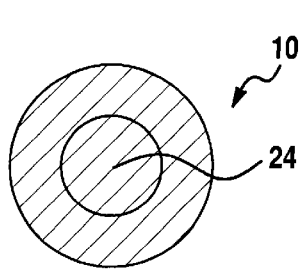
Figure 1C:
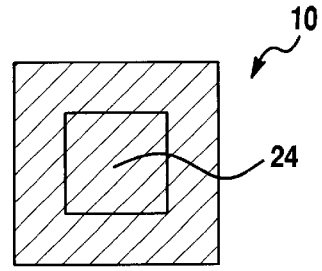

Referring now to FIGS. 1a–1c, there is shown a circuit assembly 10 made in accordance with the teachings of a first embodiment of the invention. Circuit assembly 10 is formed by "building up" or sequentially adding various layers of certain materials to a core member 12, in a conventional manner. Core member 12 is manufactured and/or formed from an electrically conductive material such as copper or a metallic and electrically conductive foil material. A pair of layers of dielectric material or conventional adhesive material 14, 16 are respectively applied and/or coupled to and "cover" the "top" and "bottom" surfaces of member 12. A layer of adhesive material 18, which in the preferred embodiment of the invention comprises a "Z-flex" adhesive material, is applied to and/or coupled to and substantially "covers" or coats the top surface of dielectric material layer 14. An electrically conductive member and/or layer 20 is connected, coupled, and/or attached to dielectric material layer 14, by way of adhesive 18 which is disposed between and operatively bonds dielectric layer 14 and conductive layer 20. In one non-limiting embodiment of the invention, electrically conductive layer 20 comprises a conventional and commercially available copper material. In a further non-limiting embodiment of the invention, electrically conductive member 20 is connected, coupled, and/or attached to adhesive material 18 and dielectric layers 14 by use of a known and conventional laminating process such as a conventional "one-step" laminating process. In an alternate embodiment, dielectric layers 14, 16 are not included in the circuit board 10.

Certain portions of electrically conductive member 20, adhesive material 18 and dielectric material 14 have been removed from an area or region 24 of the circuit assembly in a known and conventional manner such as by drilling, punching, and/or selective etching, thereby creating a notch or "blind via" 22 within circuit assembly 10. As shown, electrically conductive member 12 is "exposed" and/or remains within area or region 24, thereby allowing an electrical connection to be made through blind via or cavity 22 to member 12. It should be appreciated that an electrically conductive material (i.e., solder) can be disposed or placed within blind via 22, thereby allowing for the selective formation of desired interconnection strategies and/or component connection strategies. Particularly, by selectively inserting solder into via 22, layer or member 20 may be connected to electrical ground or core member 12. In one embodiment, the portions of layers 14, 18 and 20 form an annular ring around via 22. In one non-limiting embodiment, which is illustrated in FIG. 1b, area or region 24 has a generally circular shape and has a diameter of approximately 0.050 inches. In another non-limiting embodiment, which is illustrated in FIG. 1c, area or region 24 has a generally square shape having a length and a width of approximately 0.050 inches.

Figure 2A:
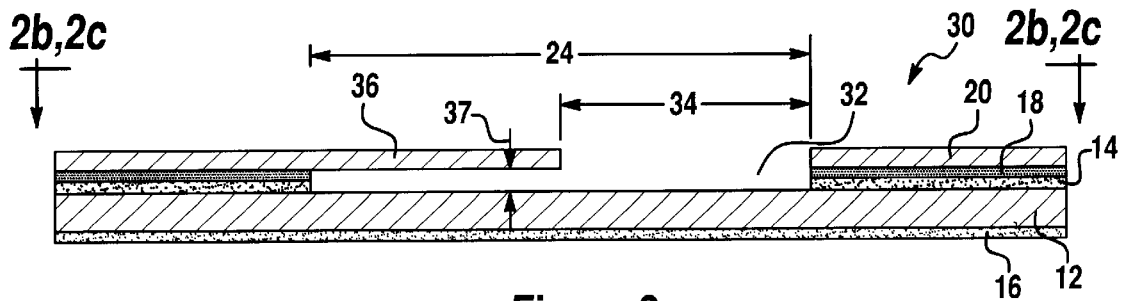
FIG. 2a is a sectional side view of a multi-layer circuit board including a "blind" via or cavity which is formed in accordance with the teachings of a second embodiment of the invention.
Figure 2B:
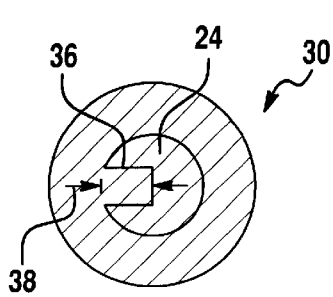
Figure 2C:
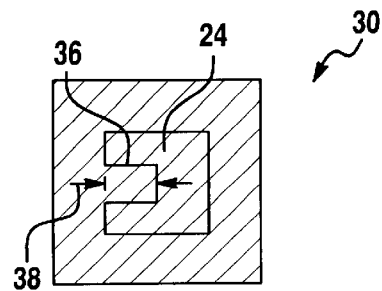

Referring now to FIGS. 2a–2c, there is shown a circuit assembly 30 made in accordance with the teachings of a second embodiment of the invention. Circuit assembly 30 is substantially identical to circuit assembly 10 with the exception that notch or blind via 22 has been replaced with notch or blind via 32. In circuit assembly 30, certain portions of adhesive material 18 and dielectric material 14 have been removed from an area or region 24 in a known and conventional manner. In this non-limiting embodiment, a portion of electrically conductive member 20 has been removed from a region 34 which is disposed within region 24, while a portion, "tab", or protrusion 36 (e.g., that portion of member 20 not removed) remains substantially and horizontally "suspended" and/or extending within region 24. The protrusion or tab 36 improves solder wetting within the blind via 32. Particularly, a gap 37 which is formed between protrusion 36 and the copper core 12 attracts and "draws in" fluids which are inserted into via 32 such as molten solder, thereby promoting the joining or connection of conductive layer 20 and copper core 12. In one embodiment, the portions of layers 14, 18 and 20 form an annular ring around via 22. In one non-limiting embodiment, which is illustrated in FIG. 2b, area or region 24 is generally circular shaped and has a diameter of approximately 0.050 inches, and protrusion 36 is generally rectangular and has a length 38 of approximately 0.025 inches. In another non-limiting embodiment, which is illustrated in FIG. 2c, area or region 24 has a generally square shape having a length and a width of approximately 0.050 inches, and protrusion 36 is generally rectangular and has a length 38 of approximately 0.025 inches.

Figure 3A:
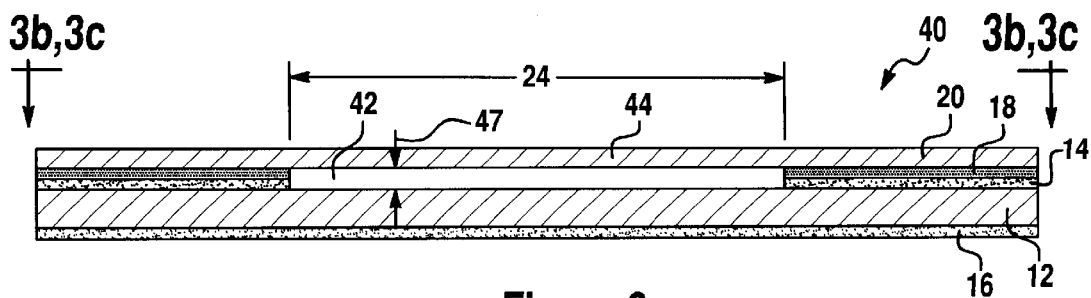
FIG. 3a is a sectional side view of a multi-layer circuit board including a "blind" via or cavity which is formed in accordance with the teachings of a third embodiment of the invention.
Figures 3B, 3C:
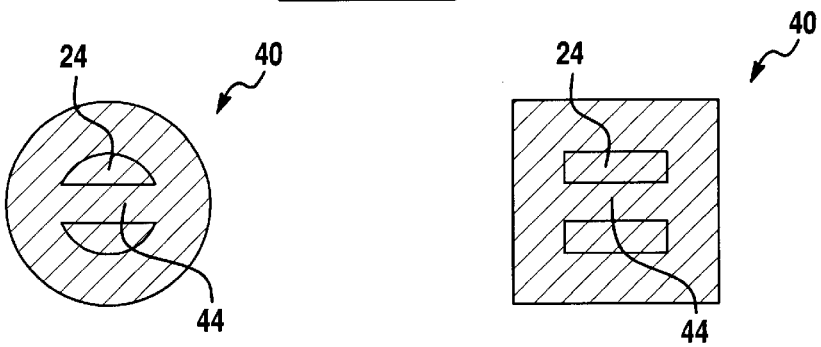

Referring now to FIGS. 3a–3c, there is shown a circuit assembly 40 made in accordance with the teachings of a second embodiment of the invention. Circuit assembly 40 is substantially identical to circuit assembly 10 with the exception that notch or blind via 22 has been replaced with notch or blind via 42. In circuit assembly 40, certain portions of adhesive material 18 and dielectric material 14 have been removed from area or region 24 in a known and conventional manner. In this non-limiting embodiment, a portion of electrically conductive member 20 has been removed from portion or region 24, while a "crossover" portion or "bridge" 44 (e.g., that portion of member 20 not removed) remains substantially and horizontally "suspended" within region 24. The bridge 44 improves solder wetting within the blind via 42. Particularly, the gap 47 which is formed between bridge 44 and the copper core 12 attracts and "draws in" fluids such as molten solder, thereby promoting the joining and/or connection of conductive layer 20 and copper core 12. In one embodiment, the portions of layers 14, 18 and 20 form an annular ring around via 22.

In one non-limiting embodiment, which is illustrated in FIG. 3b, area or region 24 is generally circular shaped and has a diameter of approximately 0.050 inches, and bridge 44 is generally rectangular and traverses region 24. In another non-limiting embodiment, which is illustrated in FIG. 3c, area or region 24 has a generally square shape having a length and a width of approximately 0.050 inches, and bridge 44 is generally rectangular and traverses region 24.

Figure 4A:
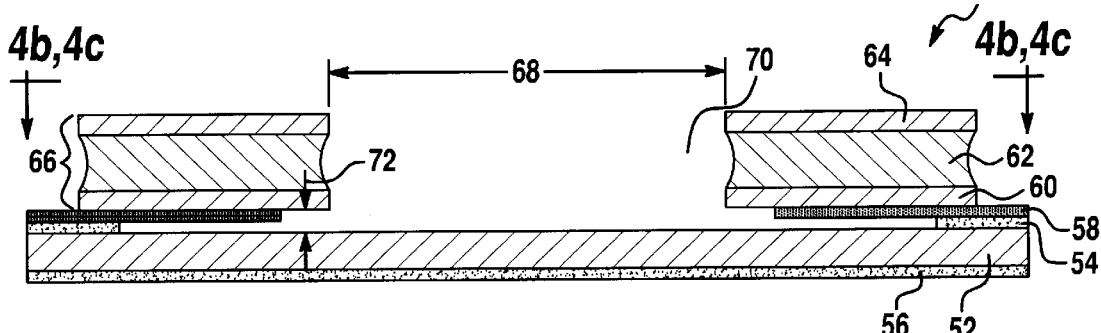
FIG. 4a is a sectional side view of a multi-layer circuit board including a "blind" via or cavity which is formed in accordance with the teachings of a fourth embodiment of the invention.
Figures 4B, 4C:
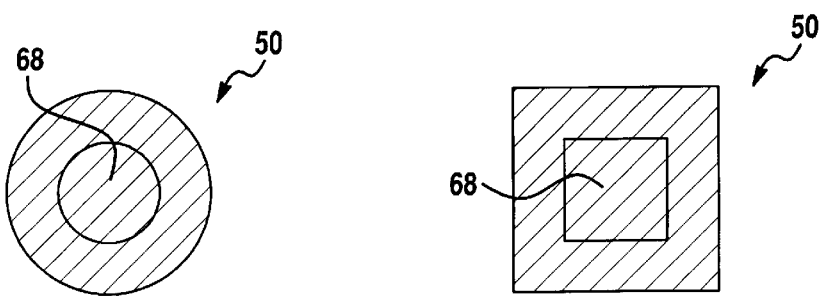

Referring now to FIGS. 4a–4c, there is shown a circuit assembly So which is made in accordance with the teachings of a fourth embodiment of the invention. Circuit assembly 50 is formed by "building up" or sequentially adding various layers of certain materials to a core member 52, in a conventional manner. Core member 52 is manufactured and/or formed from an electrically conductive material such as copper or a metallic and electrically conductive foil material, and in one non-limiting embodiment is substantially identical to core member 12. A pair of layers of dielectric material or conventional adhesive material 54, 56 are respectively applied/coupled to and "cover" the "top" and "bottom" surfaces of member 52. Circuit assembly 50 further includes a pre-circuit assembly or portion 66 having a core metal portion 62 which is preferably manufactured and/or formed from a conventional aluminum material, and a pair of electrically conductive layers 60, 64, which are respectively attached to a "bottom" surface and a "top" surface of core metal portion 62 and which are preferably manufactured and/or formed from a conventional copper material. While copper and aluminum are used to form pre-circuit assembly 66 in this non-limiting embodiment, it should be appreciated that other metals and metal combinations can be used to form pre-circuit assembly 66 and all of the other circuit boards described herein, and may include metals such as iron, nickel, silver, gold, tin and alloys thereof. Pre-circuit assembly 66 is connected, coupled, and/ or attached to dielectric material layer 54, by way of a conventional adhesive 58, which in the preferred embodiment of the invention comprises a "Z-flex" adhesive material. Adhesive 58 is applied to and/or coupled to and substantially "covers" or coats the bottom surface of layer 60 and/or the top surface of dielectric material layer 54.

Certain portions of pre-circuit assembly 66, adhesive material 58 and dielectric material 54 have been removed from an area or region 68 of the circuit assembly 50 in a known and conventional manner such as by drilling, punching, and/or selective etching, thereby creating a notch, "blind via" or cavity 70 within circuit assembly 50. As shown, electrically conductive member 52 is "exposed" and/or remains within area or region 70, thereby allowing an electrical connection to be made through blind via or notch 70 to member 52. Additionally, portions of dielectric material 54 and adhesive 58 have been conventionally removed from a region peripherally disposed around region 68, thereby forming a circumferential or peripheral gap 72 which is disposed underneath a portion of pre-circuit assembly 66. The gap 72 attracts and/or "draws in" fluids which are inserted into aperture 70 such as molten solder, thereby promoting the joining and/or connection of pre-circuit assembly 66 and core 52. The portions or layers 60, 62 and 64 cooperatively form an annular "pad" or ring, which operatively holds or retains, solder within cavity 70.

In one non-limiting embodiment, which is illustrated in FIG. 4b, area or region 68 has a generally circular shape and has a diameter of approximately 0.040 inches. In another non-limiting embodiment, which is illustrated in FIG. 4c, area or region 68 has a generally square shape having a length and a width of approximately 0.040 inches.

Figure 5A:
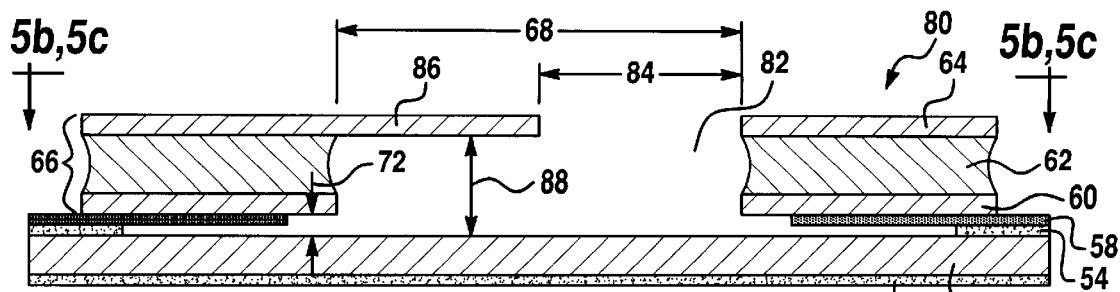
FIG. 5a is a sectional side view of a multi-layer circuit board including a "blind" via or cavity which is formed in accordance with the teachings of a fifth embodiment of the invention.
Figure 5B:
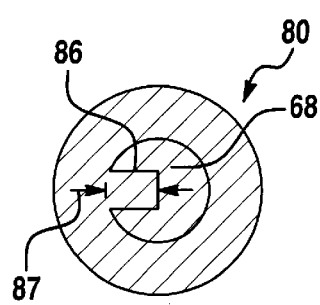
Figure 5C:
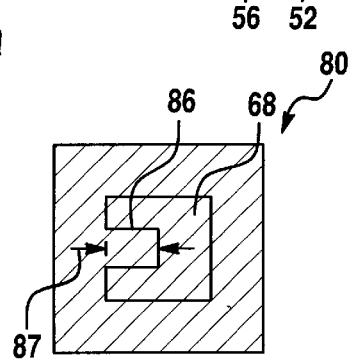

Referring now to FIGS. 5a–5c, there is shown a circuit assembly 80 made in accordance with the teachings of a fifth embodiment of the invention. Circuit assembly 80 is substantially identical to circuit assembly 50 with the exception that notch or blind via 70 has been replaced with notch or blind via 82. In this non-limiting embodiment, a portion of electrically conductive layer 64 has been removed from a region 84 which is disposed within region 68, while a portion, "tab", or protrusion 86 (e.g., that portion of layer 64 not removed) remains substantially and horizontally "suspended" and/or extending within region 68. The protrusion 86 improves solder wetting within the blind via 82. Particularly, a gap 88 which is formed between protrusion 86 and the copper core 52 is effective to attract and/or "draw in" fluids which are inserted into aperture 68 such as molten solder, thereby promoting the joining and/or connection of conductive layer 64 and copper core 52.

In one non-limiting embodiment, which is illustrated in FIG. 5b, area or region 68 is generally circular shaped and has a diameter of approximately 0.040 inches, and protrusion 86 is generally rectangular and has a length 87 of approximately 0.020 inches. In another non-limiting embodiment, which is illustrated in FIG. 5c, area or region 68 is generally square shaped having a length and a width of approximately 0.040 inches, and protrusion 86 is generally rectangular and has a length 87 of approximately 0.020 inches.

Figure 6A:
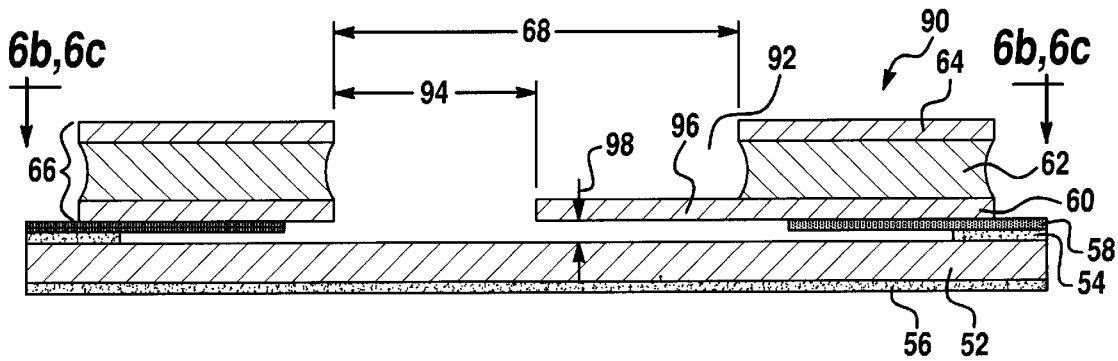
FIG. 6a is a sectional side view of a multi-layer circuit board including a "blind" via or cavity which is formed in accordance with the teachings of a sixth embodiment of the invention.
Figure 6B:
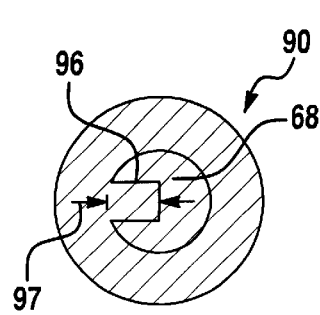
Figure 6C:
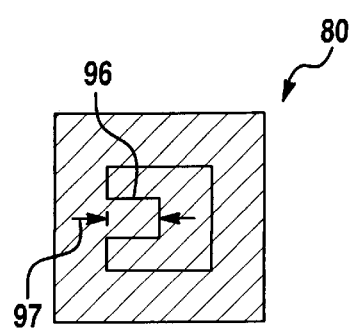

Referring now to FIGS. 6a–6c, there is shown a circuit assembly 90 made in accordance with the teachings of a sixth embodiment of the invention. Circuit assembly 90 is substantially identical to circuit assembly 50 with the exception that notch or blind via 70 has been replaced with notch or blind via 92. In this non-limiting embodiment, a portion of electrically conductive layer 60 has been removed from a region 94 which is disposed within region 68, while a portion, "tab", or protrusion 96 (e.g., that portion of layer 60 not removed) remains substantially and horizontally "suspended" and/or extending within region 68. The protrusion 96 improves solder wetting within the blind via 92. Particularly, the gap 98 which is formed between protrusion 96 and the copper core 52 attracts and/or "draws in" fluids which are inserted into aperture 92 such as molten solder, thereby promoting the joining of conductive layer 60 and copper core 52.

In one non-limiting embodiment, which is illustrated in FIG. 6b, area or region 68 is generally circular shaped and has a diameter of approximately 0.040 inches, and protrusion 96 is generally rectangular and has a length 97 of approximately 0.020 inches. In another non-limiting embodiment, which is illustrated in FIG. 6c, area or region 68 is generally square shaped having a length and a width of approximately 0.040 inches, and protrusion 96 is generally rectangular and has a length 97 of approximately 0.020 inches.

Referring now to FIGS. 7a–7d, there is shown a circuit assembly 100 made in accordance with the teachings of a seventh embodiment of the invention. Circuit assembly 100 is substantially identical to circuit assembly 50 with the exception that notch or blind via 70 has been replaced with notch or blind via 102. In this non-limiting embodiment, portions of electrically conductive layers 60, 64 have been respectively removed from regions 103, 104 which are disposed within region 68, while portions, "tabs", or protrusions 106, 107 (e.g., those portions of layers 60, 64 not removed) remain substantially and horizontally "suspended" and/or extending within region 68 or cavity 102. The protrusions 106, 107 improve solder wetting within the blind via 102. Particularly, the gaps 106a, 107a which are formed between the respective protrusions 106, 107 and the copper core 52 attract and/or "draw in" fluids which are introduced into aperture 102 such as molten solder, thereby promoting the joining and/or connection of conductive layers 60, 64 and copper core 52.

Figure 7A:
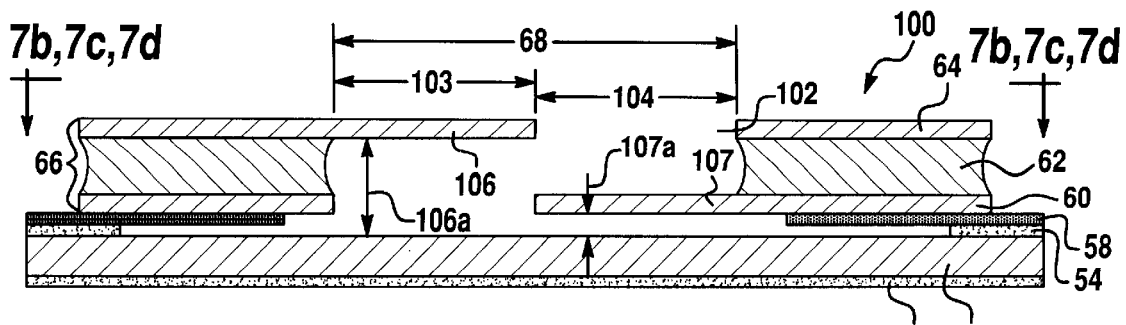
FIG. 7a is a sectional side view of a multi-layer circuit board including a "blind" via or cavity which is formed in accordance with the teachings of a seventh embodiment of the invention.
Figure 7B:
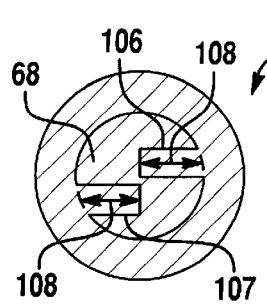
Figure 7C:
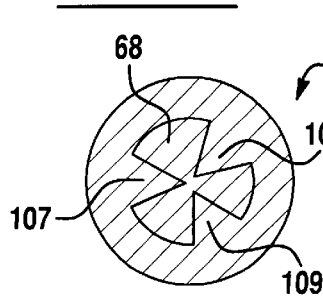
Figure 7D:
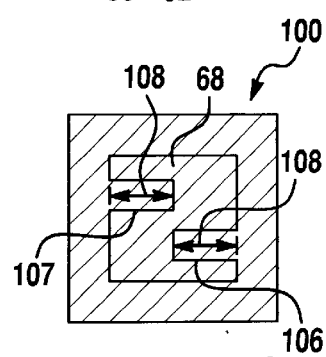

In one non-limiting embodiment, which is illustrated in FIG. 7b, area or region 68 is generally circular shaped and has a diameter of approximately 0.040 inches. Protrusions 106, 107 are each generally rectangular and have a substantially identical length 108 of approximately 0.020 inches. In another non-limiting embodiment, which is illustrated in FIG. 7c, area or region 68 is generally circular shaped and has a diameter of approximately 0.040 inches. In this non-limiting embodiment, protrusions 106, 107 are generally triangular in shape, and a third generally triangular "tab" or protrusion 109 is formed within material layer 60 or 64 and extends into portion 68. In another non-limiting embodiment, which is illustrated in FIG. 7d, area or region 68 is generally square shaped having a length and a width of approximately 0.040 inches. In this non-limiting embodiment, protrusions 106 and 107 are generally rectangular in shape and have a length 108 of approximately 0.020 inches.

Figure 8A:
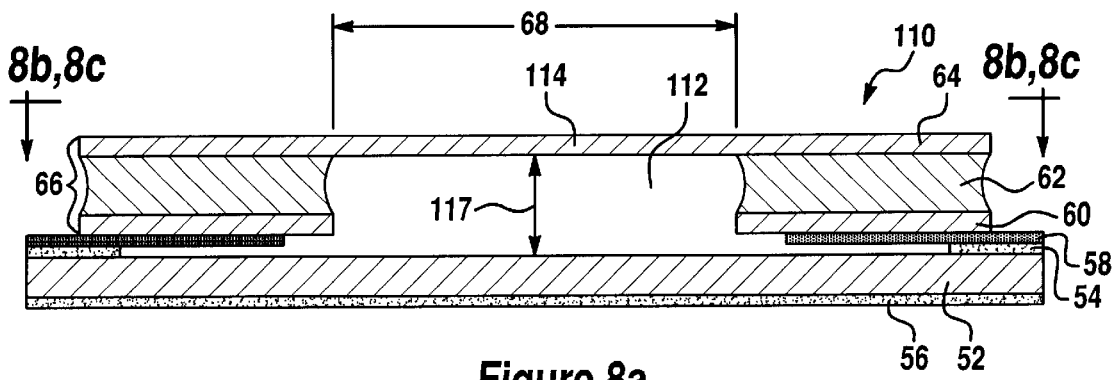
FIG. 8a is a sectional side view of a multi-layer circuit board including a "blind" via or cavity which is formed in accordance with the teachings of an eighth embodiment of the invention.
Figure 8B:
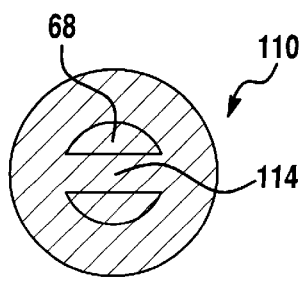
Figure 8C:
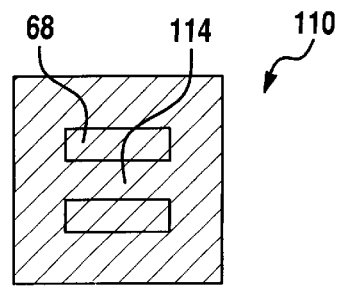

Referring now to FIGS. 8a–8c, there is shown a circuit assembly 110 made in accordance with the teachings of a ninth embodiment of the invention. Circuit assembly 110 is substantially identical to circuit assembly 50 with the exception that notch or blind via 70 has been replaced with notch or blind via 112. In this non-limiting embodiment, a portion of electrically conductive layer 64 has been removed from portion or region 68, while a "crossover" portion or "bridge" 114 (e.g., that portion of layer 64 not removed) remains substantially and horizontally "suspended" within region 68. The bridge 114 improves solder wetting within the blind via 112. Particularly, the gap 117 which is formed between "bridge" 114 and the copper core 52 attracts and "draws in" fluids which are introduced into via 112 such as molten solder, thereby promoting the joining and/or connection of conductive layer 64 and copper core 52.

In one non-limiting embodiment, which is illustrated in FIG. 8b, area or region 68 is generally circular shaped and has a diameter of approximately 0.040 inches, and bridge 114 is generally rectangular and traverses region 68. In another non-limiting embodiment, which is illustrated in FIG. 8c, area or region 68 has a generally square shape having a length and a width of approximately 0.040 inches, and bridge 114 is generally rectangular and traverses region 68.

Figure 9A:
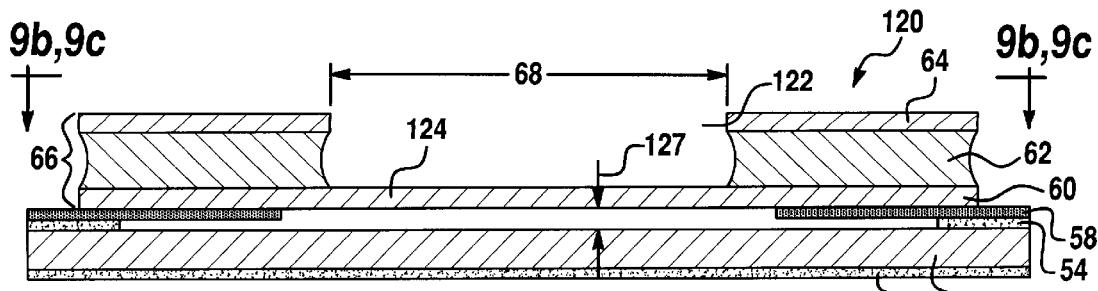
FIG. 9a is a sectional side view of a multi-layer circuit board including a "blind" via or cavity which is formed in accordance with the teachings of a ninth embodiment of the invention.
Figure 9B:
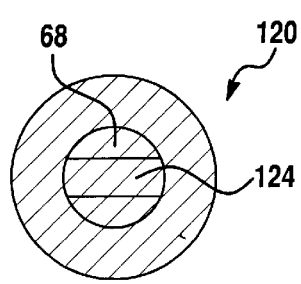
Figure 9C:
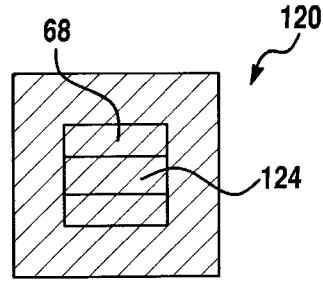

Referring now to FIGS. 9a–9c, there is shown a circuit assembly 120 made in accordance with the teachings of an ninth embodiment of the invention. Circuit assembly 120 is substantially identical to circuit assembly 50 with the exception that notch or blind via 70 has been replaced with notch or blind via 122. In this non-limiting embodiment, a portion of electrically conductive layer 64 has been removed from portion or region 68, while a "crossover" portion or "bridge" 124 (e.g., that portion of layer 60 not removed) remains substantially and horizontally "suspended" within region 68. The bridge 124 improves solder wetting within the blind via 122. Particularly, the gap 127 which is formed between "bridge" 124 and the copper core 52 attracts and "draws in" fluids such as molten solder, thereby promoting the joining and/or connection of conductive layer 60 and copper core 52.

In one non-limiting embodiment, which is illustrated in FIG. 9b, area or region 68 is generally circular shaped and has a diameter of approximately 0.040 inches, and bridge 124 is generally rectangular and traverses region 68. In another non-limiting embodiment, which is illustrated in FIG. 9c, area or region 68 has a generally square shape having a length and a width of approximately 0.040 inches, and bridge 124 is generally rectangular and traverses region 68.

Figure 10A:
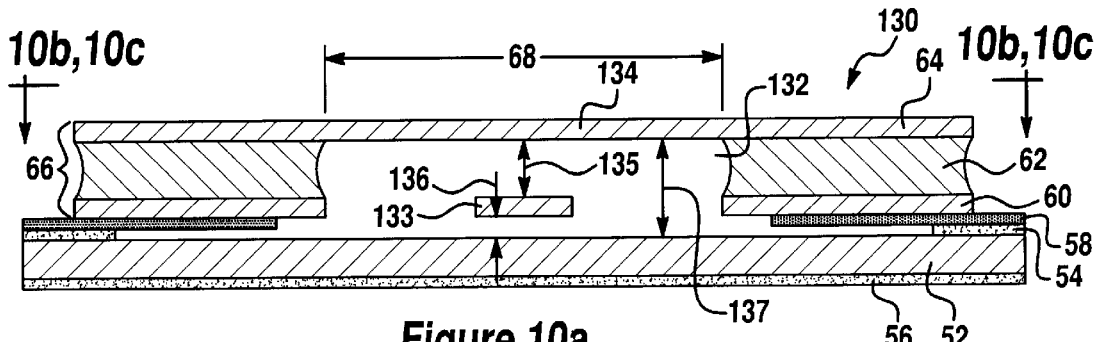
FIG. 10a is a sectional side view of a multi-layer circuit board including a "blind" via or cavity which is formed in accordance with the teachings of a tenth embodiment of the invention.
Figure 10B:
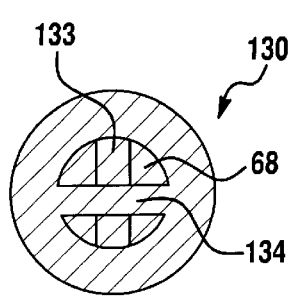
Figure 10C:
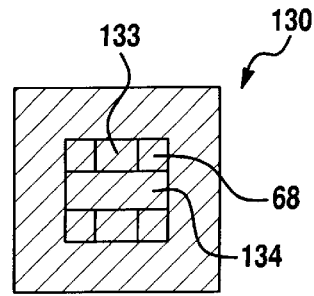

Referring now to FIGS. 10a–10c, there is shown a circuit assembly 130 made in accordance with the teachings of a tenth embodiment of the invention. Circuit assembly 130 is substantially identical to circuit assembly 50 with the exception that notch or blind via 70 has been replaced with notch or blind via 132. In this non-limiting embodiment, a portion of electrically conductive layer 60 has been removed from portion or region 68, while a "crossover" portion or "bridge" 133 (e.g., that portion of layer 60 not removed) remains substantially and horizontally "suspended" within region 68. Also, in this non-limiting embodiment, a portion of electrically conductive layer 64 has been removed from portion or region 68 while a second "crossover" portion or "bridge" 134 (e.g., that portion of member 64 not removed) remains substantially and horizontally "suspended" within region 68. The bridges 133, 134 improve solder wetting within the blind via 132. Particularly, the gaps 135, 136 and 137 which are formed between "bridge" 134, "bridge" 133 and the copper core 52 attract and "draws in" fluids which are selectively introduced into via 132 such as molten solder, thereby promoting the joining and/or connection of conductive layers 60, 64 and copper core 52.

In one non-limiting embodiment, which is illustrated in FIG. 10b, area or region 68 is generally circular shaped and has a diameter of approximately 0.040 inches, and bridges 133, 134 are generally rectangular and traverse region 68. In another non-limiting embodiment, which is illustrated in FIG. 10c, area or region 68 has a generally square shape having a length and a width of approximately 0.040 inches, and bridges 133, 134 are generally rectangular and traverse region 68.

Figure 11A:
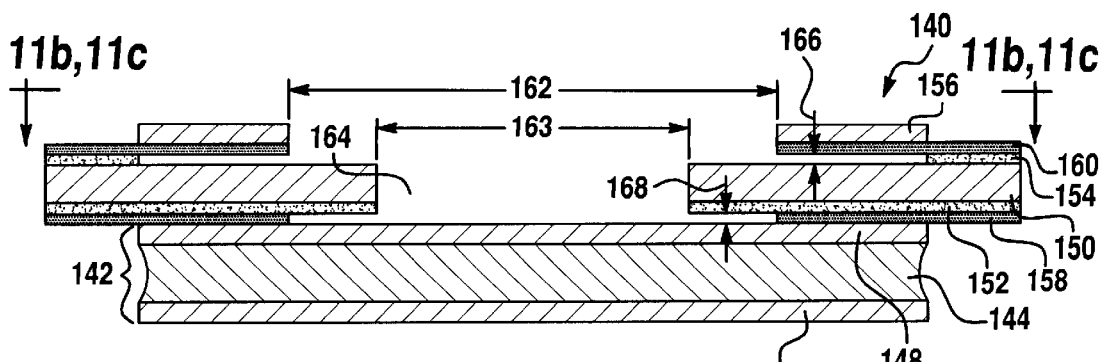
FIG. 11a is a sectional side view of a multi-layer circuit board including a "blind" via or cavity which is formed in accordance with the teachings of a eleventh embodiment of the invention.
Figure 11B:
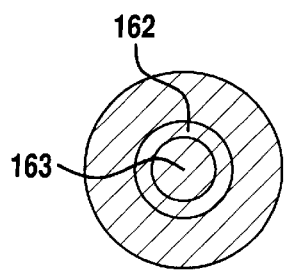
Figure 11C:
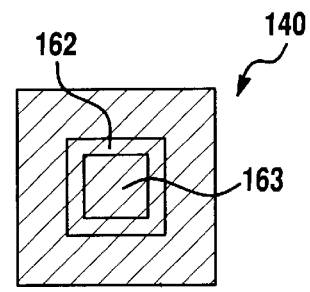

Referring now to FIGS. 11a–11c, there is shown a circuit assembly 140 made in accordance with the teachings of an eleventh embodiment of the present invention. Circuit assembly 140 is formed by "building up" or sequentially adding various layers of certain material to a pre-circuit assembly 142. Pre-circuit assembly 142 includes a core metal portion 144 which is preferably manufactured and/or formed from a conventional aluminum material, and a pair of electrically conductive layers 146, 148 which are respectively attached to the bottom surface and the top surface of core metal portion 144 and which are preferably manufactured and/or formed from a conventional copper material. Circuit assembly 140 further includes a core member 150. Core member 150 is manufactured and/or formed from an electrically conductive material such as copper or a metallic and electrically conductive foil material, and in one non-limiting embodiment is substantially identical to core member 12. A pair of layers of dielectric material 152, 154 are respectively applied and/or coupled to and "cover" the "bottom" and "top" surfaces of member 150. Circuit assembly 140 further includes an electrically conductive member 156. In a non-limiting embodiment, conductive member 156 is manufactured and/or formed from an electrically conductive material such as copper or a metallic and electrically conductive foil material.

Conventional adhesive layers 158, 160 are applied and/or coupled to and substantially "cover" or coat the "top" surface of pre-circuit assembly 142, the "bottom" surface of dielectric material layer 152, the "top" surface of dielectric material layer 154 and the "bottom" surface of member 156. Conductive member 156 is connected, coupled and/or attached to dielectric layer 154 by way of adhesive layer 158 which is disposed between and operatively bonds conductive member 156 and dielectric layer 154. Adhesive layer 160 is disposed between and operatively bonds conductive member 148 of pre-circuit assembly 142 and dielectric layer 152. In one non-limiting embodiment of the invention adhesives 158, 160 comprise "Z-flex" adhesive materials. In another non-limiting embodiment of the invention, electrically conductive member 156 and pre-circuit assembly 142 are connected, coupled, and/or attached to adhesive materials 158, 160 and dielectric layers 152, 154 by use of a known and conventional laminating process such as a conventional "one-step" laminating process.

In the non-limiting embodiment shown in FIGS. 11a–11c, certain portions of members 150, 156, adhesive materials 158, 160, and dielectric materials 152, 154 have been removed from areas or regions 162, 163 of the circuit assembly 140 in a known and conventional manner such as by drilling, punching and/or selective etching, thereby creating a notch, "blind via" or cavity 164 within circuit assembly 140. As shown, pre-circuit assembly 142 is "exposed" and/or remains within area or region 162, thereby allowing an electrical connection to be made through blind via or notch 164 to pre-circuit assembly 142. Specifically, electrical connections may be made from conductive layer 148 of pre-circuit assembly 142 to conductive member 156 and to core member 150.

Additionally, portions of dielectric material 154 and adhesives 158 have been conventionally removed from regions peripherally disposed around regions 162, 163 thereby forming circumferential peripheral gaps 166, 168 which are respectively disposed above portions of members 150 and 148. The gaps 166, 168 attract and "draw in" fluids such as molten solder, thereby promoting the joining and/or connection of layer 148 of pre-circuit assembly 142 and members 150, 156. The portions or layers 156, 160, 154, 150, 152, and 158 cooperatively form an annular "pad" or ring around via 164, which operatively holds or retains solder within via 164.

In one non-limiting embodiment, which is illustrated in FIG. 11b, area or region 162 is generally circular shaped with a diameter of approximately 0.050 inches and area or region 163 is also generally circular shaped with a diameter of approximately 0.040 inches. In another non-limiting embodiment, which is illustrated in FIG. 11C, area or region 162 is generally square shaped having a length and width of approximately 0.050 inches and area or region 163 is also generally square shaped having a length and width of approximately 0.040 inches.

Figure 12A:
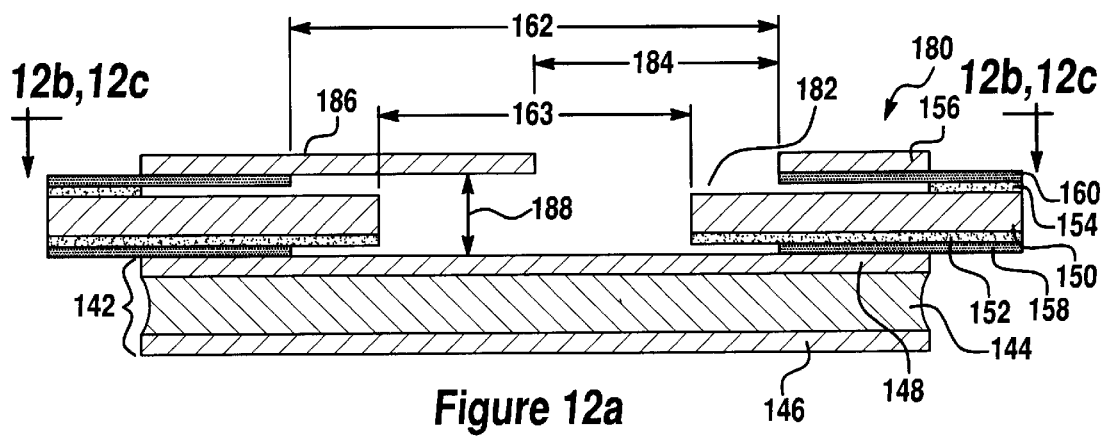
FIG. 12a is a sectional side view of a multi-layer circuit board including a "blind" via or cavity which is formed in accordance with the teachings of a twelfth embodiment of the invention.
Figure 12B:
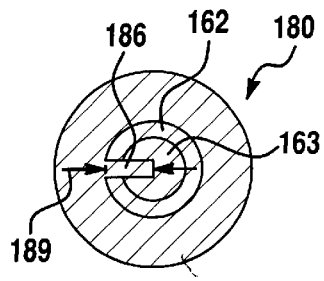
Figure 12C:
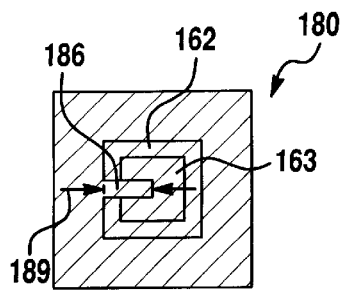

Referring now to FIGS. 12a–12c there is shown a circuit assembly 180 made in accordance with the teachings of a twelfth embodiment of the invention. Circuit assembly 180 is substantially identical to circuit assembly 140 with the exception that notch or blind via 164 has been replaced with notch or blind via 182. In this non-limiting embodiment, a portion of conductive member 156 has been removed from a region 184 which is disposed within region 162, while a portion, "tab", or protrusion 186 (e.g., that portion of member 156 not removed) remains substantially and horizontally "suspended" and/or extending within region 162. The protrusion 186 improves solder wetting within the blind via 182. Particularly, the gap 188 which is formed between protrusion 186 and the pre-circuit assembly 142 is effective to attract and/or "draw in" fluids such as molten solder, thereby promoting the joining and/or connection of member 156 and layer 148 of pre-circuit assembly 142.

In one non-limiting embodiment, which is illustrated in FIG. 12b, area or region 162 is generally circular shaped with a diameter of approximately 0.050 inches, and area or region 163 is also generally circular shaped with a diameter of approximately 0.040 inches and protrusion 186 is generally rectangular and has a length 189 of approximately 0.025 inches. In another non-limiting embodiment, which is illustrated in FIG. 12c, area or region 162 is generally square shaped having a length and a width of approximately 0.050 inches, and area 163 is also generally square shaped having a length and width of approximately 0.040 inches and protrusion 186 is generally rectangular and has a length 189 of approximately 0.025 inches.

Figure 13A:
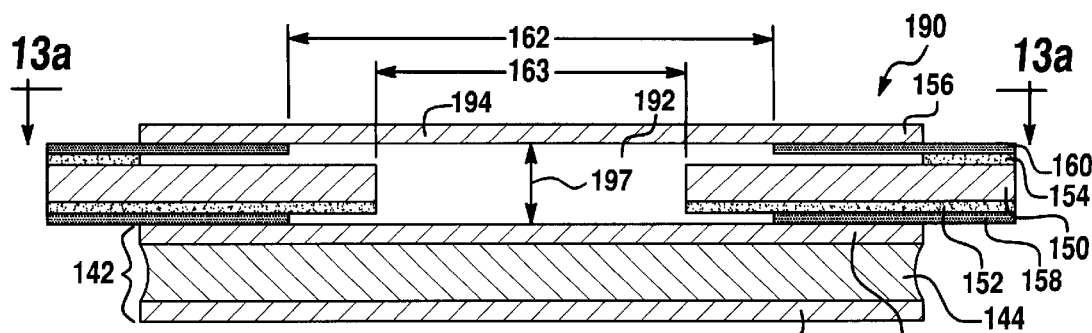
FIG. 13a is a sectional side view of a multi-layer circuit board including a "blind" via or cavity which is formed in accordance with the teachings of a thirteenth embodiment of the invention.
Figure 13B:
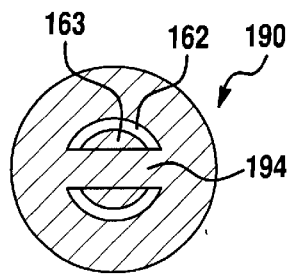
Figure 13C:
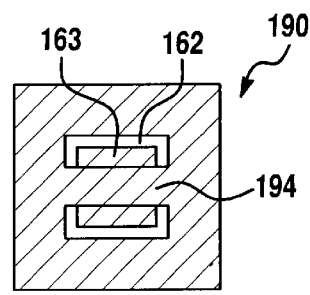

Referring now to FIGS. 13a–13c, there is shown a circuit assembly 190 made in accordance with the teachings of a thirteenth embodiment of the invention. Circuit assembly 190 is substantially identical to circuit assembly 140 with the exception that notch or blind via 164 has been replaced with notch or blind via 192. In this non-limiting embodiment, a portion of conductive member 156 has been removed from portion or region 162, while a "crossover" portion or "bridge" 194 (e.g., that portion of member 156 not removed) remains substantially and horizontally "suspended" within region 162. The bridge 194 improves solder wetting within the blind via 192. Particularly, the gap 197 which is formed between "bridge" 194 and the pre-circuit assembly 142 attracts and "draws in" fluids such as molten solder, thereby promoting the joining and/or connection of member 156 and layer 148 of pre-circuit assembly 142.

In one non-limiting embodiment, which is illustrated in FIG. 13b, area or region 162 is generally circular shaped with a diameter of approximately 0.050 inches, and area 163 is also generally circular shape with a diameter of approximately 0.040 inches and bridge 194 is generally rectangular and traverses region 162. In another non-limiting embodiment, which is illustrated in FIG. 13c, area or region 162 is generally square shaped having a length and a width of approximately 0.050 inches, and area 163 is also generally square shaped having a length and a width of approximately 0.040 inches and bridge 194 is generally rectangular and traverses region 162.

Figure 14A:
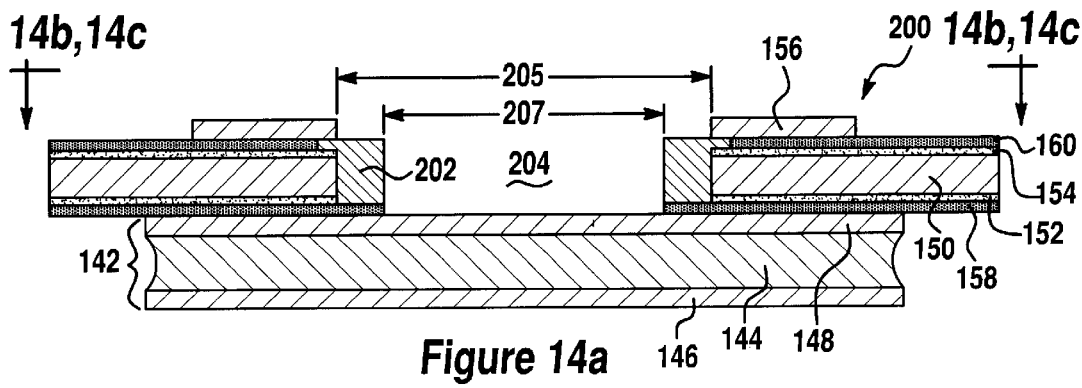
FIG. 14a is a sectional side view of a multi-layer circuit board including a "blind" via or cavity which is formed in accordance with the teachings of a fourteenth embodiment of the invention.
Figure 14B:
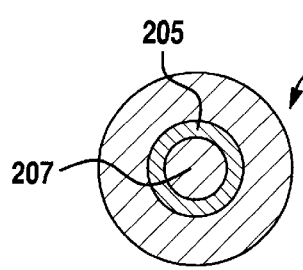
Figure 14C:
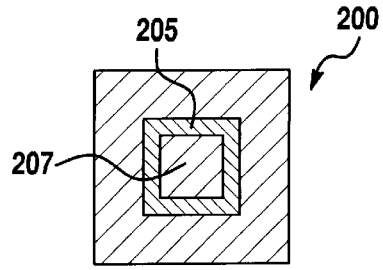

Referring now to FIGS. 14a–14c, there is shown a circuit assembly 200 made in accordance with the teachings of a fourteenth embodiment of the invention. Circuit assembly 200 is substantially identical to circuit assembly 140 with the exception that aperture 164 has been replaced with aperture or via 204. Particularly, certain portions of members 150, 156, adhesive material 160, and dielectric materials 152, 154 have been removed from an area or region 205 of the circuit assembly 200 in a known and conventional manner such as by drilling, punching and/or selective etching and a solder mask 202 has been attached, coupled and/or adhered to member 150, adhesive materials 158, 160 and dielectric materials 152, 154 to define a newly shaped via or notch 204. In one non-limiting embodiment, solder mask 202 is manufactured and/or formed from a known and conventional masking material such that mask 202 prevents solder from entering and/or traveling within trace lines (i.e. spaces or lines that exist between different layers, materials, and or members of a circuit board) within assembly 200 and such that mask 202 inhibits electrical signals which are transmitted from assembly 142 and/or member 156 from being communicated to core member 150.

In one non-limiting embodiment, which is illustrated in FIG. 14b, area or region 205 is generally circular shaped with a diameter of approximately 0.050 inches and area or region 207 is also generally circular shaped as defined by solder mask 202 and has a diameter of approximately 0.040 inches. In another non-limiting embodiment, which is illustrated in FIG. 14c, area or region 205 is generally square shaped having a length and a width of approximately 0.050 inches and area or region 207 is also generally square shaped as defined by solder mask 202 and has a length and a width of approximately 0.040 inches.

Figure 15A:
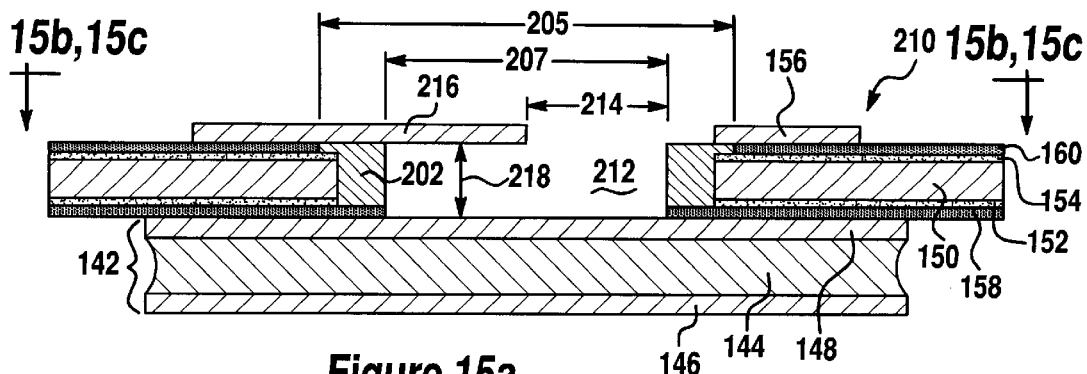
FIG. 15a is a sectional side view of a multi-layer circuit board including a "blind" via or cavity which is formed in accordance with the teachings of a fifteenth embodiment of the invention.
Figure 15B:
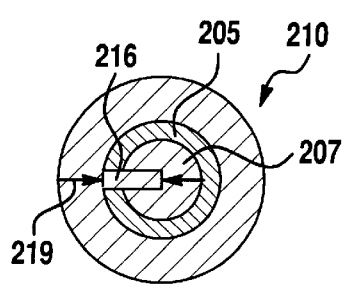
Figure 15C:
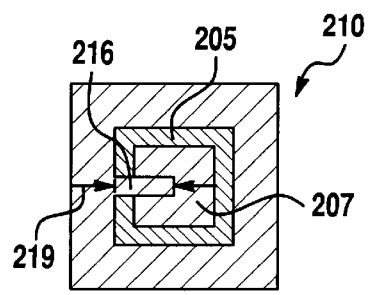

Referring now to FIGS. 15a–15c, there is shown a circuit assembly 210 made in accordance with the teachings of a fifteenth embodiment of the invention. Circuit assembly 210 is substantially identical to circuit assembly 200 with the exception that notch or blind via 204 has been replaced with notch or blind via 212. In this non-limiting embodiment, a portion of conductive member 156 has been removed from a region 214 which is disposed within region 205, while a portion, "tab", or protrusion 216 (e.g., that portion of member 156 not removed) remains substantially and horizontally "suspended" and/or extending within region 205. The protrusion 216 improves solder wetting within the blind via 212. Particularly, the gap 218 which is formed between protrusion 216 and the pre-circuit assembly 142 is effective to attract and/or "draw in" fluids such as molten solder, thereby promoting the joining and/or connection of members 156 and pre-circuit assembly 142.

In one non-limiting embodiment, which is illustrated in FIG. 15b, area or region 205 is generally circular shaped with a diameter of approximately 0.050 inches and area 207 is also generally circular shaped with a diameter of approximately 0.040 inches as defined by the solder mask 202 and protrusion 216 is generally rectangular and has a length 219 of approximately 0.025 inches. In another non-limiting embodiment, which is illustrated in FIG. 15c, area or region 205 is generally square shaped having a length and a width of approximately 0.050 inches and area or region 207 is also generally square shaped having a length and a width of approximately 0.040 inches as defined by solder mask 202 and protrusion 216 is generally rectangular and has length 219 of approximately 0.025 inches.

Figure 16A:
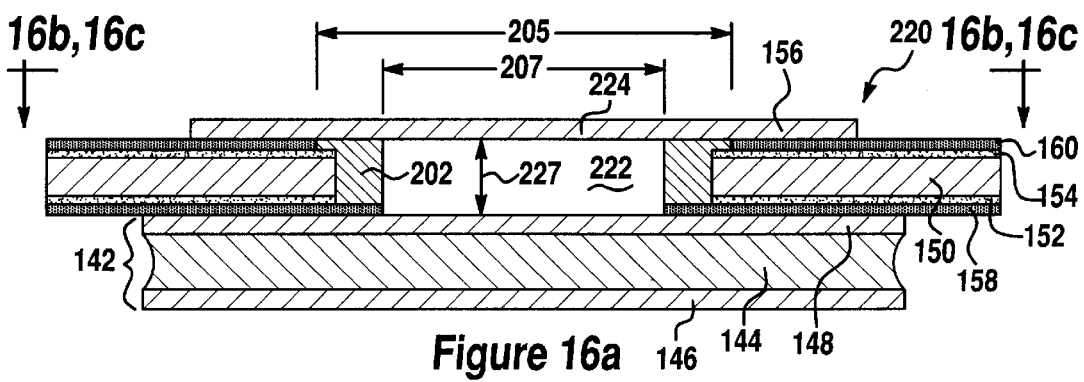
FIG. 16a is a sectional side view of a multi-layer circuit board including a "blind" via or cavity which is formed in accordance with the teachings of a sixteenth embodiment of the invention.
Figure 16B:
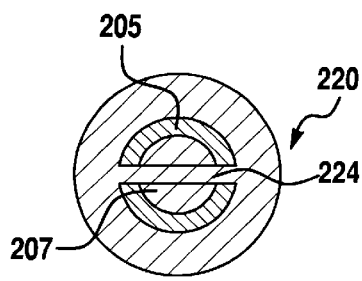
Figure 16C:
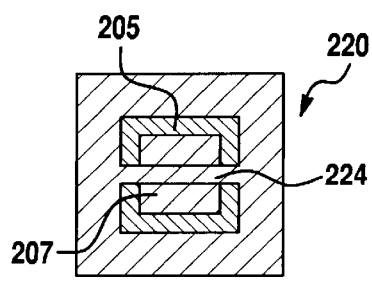

Referring now to FIGS. 16a–16c, there is shown a circuit assembly 220 made in accordance with the teachings of a sixteenth embodiment of the invention. Circuit assembly 220 is substantially identical to circuit assembly 200 with the exception that notch or blind via 204 has been replaced with notch or blind via 222. In this non-limiting embodiment, a portion of conductive member 156 has been removed from portion or region 205, while a "crossover" portion or "bridge" 224 (e.g., that portion of member 156 not removed) remains substantially and horizontally "suspended" within region 205. The bridge 224 improves solder wetting within the blind via 222. Particularly, the gap 227 which is formed between "bridge" 224 and the pre-circuit assembly 142 attracts and "draws in" fluids such as molten solder, thereby promoting the joining and/or connection of member 156 and pre-circuit assembly 142.

In one non-limiting embodiment, which is illustrated in FIG. 16b, area or region 205 is generally circular shaped with a diameter of approximately 0.050 inches and area or region 207 is also generally circular shaped as defined by the solder mask 222 and has a diameter of approximately 0.040 inches and bridge 224 is generally rectangular and traverses region 205. In another non-limiting embodiment, which is illustrated in FIG. 16c, area or region 205 is generally square shaped having a length and a width of approximately 0.050 inches and area or region 207 is also generally square shaped and has a length and a width of approximately 0.040 inches and bridge 224 is generally rectangular and traverses region 205.

Figure 17B:
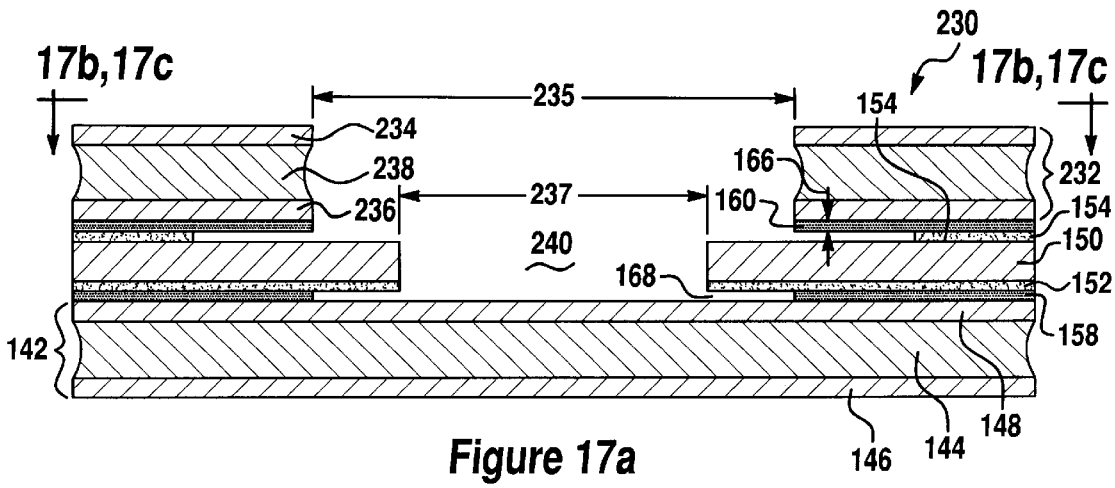
Figure 17B:
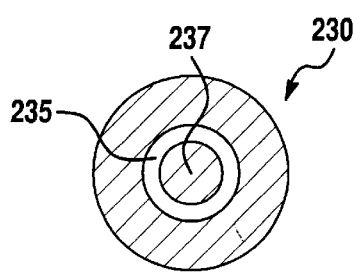
Figure 17C:
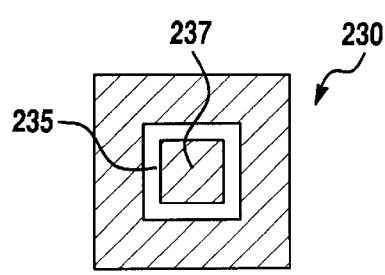

Referring now to FIGS. 17a–17c, there is shown a circuit assembly 230 made in accordance with the teachings of a seventeenth embodiment of the invention. Circuit assembly 230 is substantially identical to circuit assembly 140 with the exception that conductive member 156 has been replaced with pre-circuit assembly 232. Pre-circuit assembly 232 includes a core metal portion 238 which is preferably manufactured and/or formed from a conventional aluminum, and a pair of electrically conductive layers 234, 236, which are respectively attached to the bottom surface and the top surface of core metal portion 238 and which are preferably manufactured and/or formed from a conventional copper material. A certain portion of assembly 232 is removed from region 235 along with certain portions of member 150, adhesive materials 158, 160 and dielectric material materials 152, 154 in a known and conventional manner such as by drilling, punching, and/or selective etching, thereby creating a notch, cavity or "blind via" 240. The portions or layers 234, 236 and 238 cooperatively form an annular "pad" or ring around via 24, which operatively holds or retains, solder within cavity 240. Additionally, portions of dielectric material 154 and adhesive 158 have been conventionally removed from regions peripherally disposed around regions 235, 237 thereby forming circumferential peripheral gaps 166, 168 which are disposed underneath portions of members 150 and pre-circuit assembly 232. The gaps 166, 168 attract and "draw in" fluids which are introduced into via 240 such as molten solder, thereby promoting the joining and/or connection of layer 148 of pre-circuit assembly 142 and member 150 and pre-circuit assembly 232.

In one non-limiting embodiment, which is illustrated in FIG. 17b, area or region 235 is generally circular shaped with a diameter of approximately 0.050 inches and area or region 163 is also generally circular shaped and has a diameter of approximately 0.040 inches. In another non-limiting embodiment, which is illustrated in FIG. 17*c*, area or region 235 is generally square shaped having a length and a width of approximately 0.050 inches and area or region 237 is also generally square shaped and has a length and a width of approximately 0.040 inches.

Figure 18B:
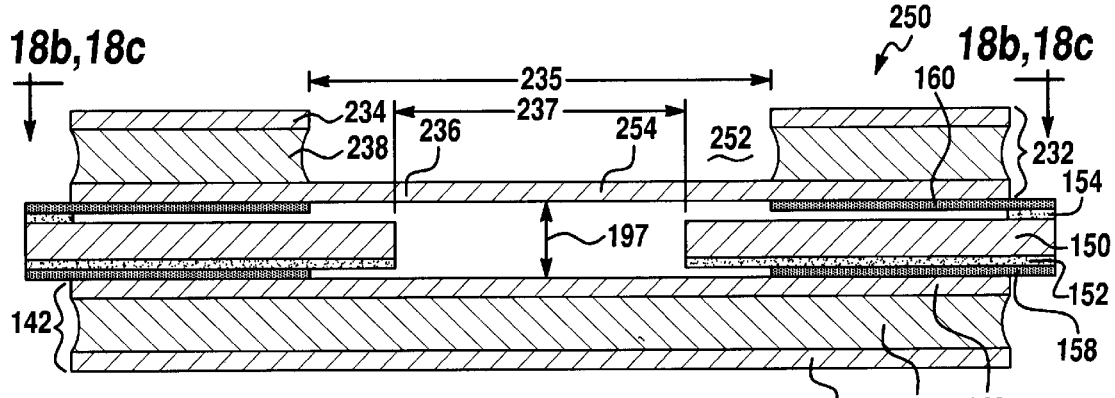
Figure 18B:
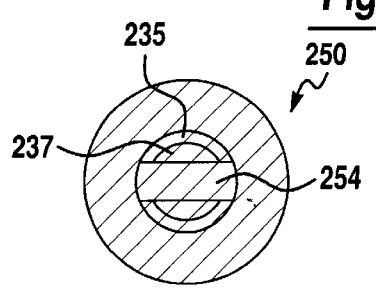
Figure 18C:
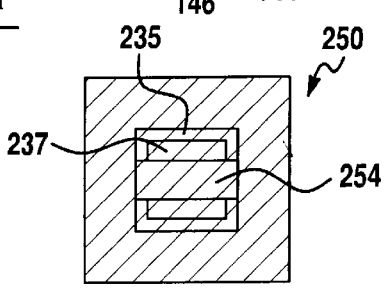

Referring now to FIGS. 18*a*–18*c*, there is shown a circuit assembly 250 made in accordance with the teachings of an eighteenth embodiment of the invention. Circuit assembly 250 is substantially identical to circuit assembly 230 with the exception that notch or blind via 240 has been replaced with notch or blind via 252. In this non-limiting embodiment, a portion of conductive layer 236 has been removed from portion or region 235, while a "crossover" portion or "bridge" 254 (e.g., that portion of layer 236 not removed) remains substantially and horizontally "suspended" within region 235. The bridge 254 improves solder wetting within the blind via 252. Particularly, the gap 197 which is formed between "bridge" 254 and the pre-circuit assembly 142 attracts and "draws in" fluids such as molten solder, thereby promoting the joining and/or connection of member or layer 236 and pre-circuit assembly 142.

In one non-limiting embodiment, which is illustrated in FIG. 18*b*, area or region 235 is generally circular shaped with a diameter of approximately 0.050 inches, and area 237 is also generally circular shaped with a diameter of approximately 0.040 inches and bridge 254 is generally rectangular and traverses region 235. In another non-limiting embodiment, which is illustrated in FIG. 18*c*, area or region 235 is generally square shaped having a length and a width of approximately 0.050 inches, and area or region 237 is also generally square shaped having a length and a width of approximately 0.040 inches and bridge 254 is generally rectangular and traverses region 235.

Figure 19A:
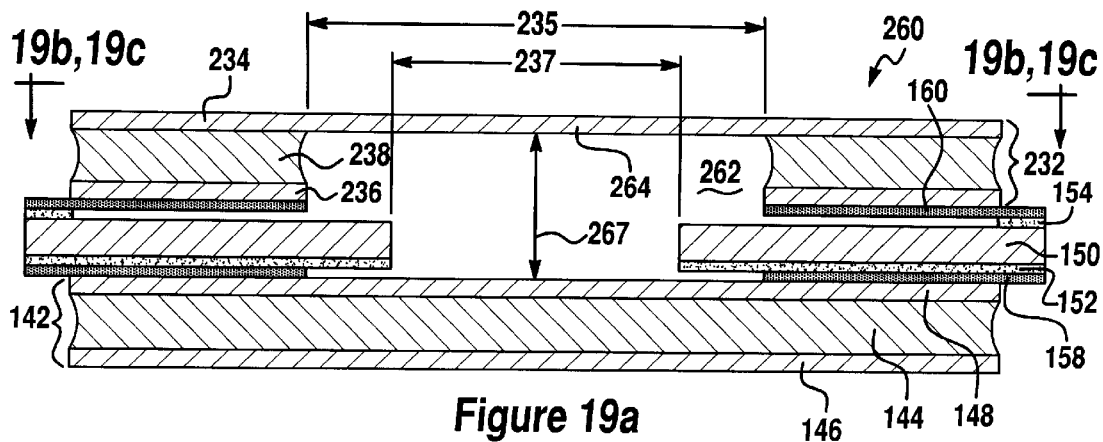
FIG. 19a is a sectional side view of a multi-layer circuit board including a "blind" via or cavity which is formed in accordance with the teachings of a nineteenth embodiment of the invention.
Figure 19B:
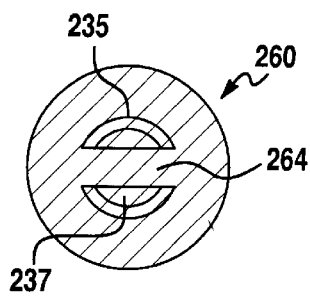
Figure 19C:
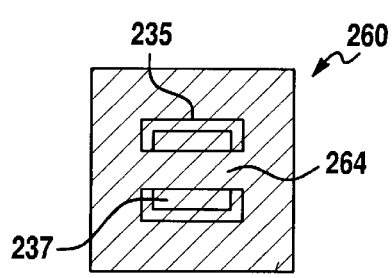

Referring now to FIGS. 19*a*–19*c*, there is shown a circuit assembly 260 made in accordance with the teachings of a nineteenth embodiment of the invention. Circuit assembly 260 is substantially identical to circuit assembly 230 with the exception that notch or blind via 240 has been replaced with notch or blind via 262. In this non-limiting embodiment, a portion of conductive layer 234 has been removed from portion or region 235, while a "crossover" portion or "bridge" 264 (e.g., that portion of layer 234 not removed) remains substantially and horizontally "suspended" within region 235. The bridge 264 improves solder wetting within the blind via 262. Particularly, the gap 267 which is formed between "bridge" 264 and the pre-circuit assembly 142 attracts and "draws in" fluids such as molten solder, thereby promoting the joining and/or connection of pre-circuit assemblies 142, 232.

In one non-limiting embodiment, which is illustrated in FIG. 19*b*, area or region 235 is generally circular shaped with a diameter of approximately 0.050 inches, and area or region 237 is also generally circular shape with a diameter of approximately 0.040 inches and bridge 264 is generally rectangular and traverses region 235. In another non-limiting embodiment, which is illustrated in FIG. 19*c*, area or region 235 is generally square shaped having a length and a width of approximately 0.050 inches, and area or region 237 is also generally square shaped having a length and a width of approximately 0.040 inches and bridge 264 is generally rectangular and traverses region 235.

Figure 20A:
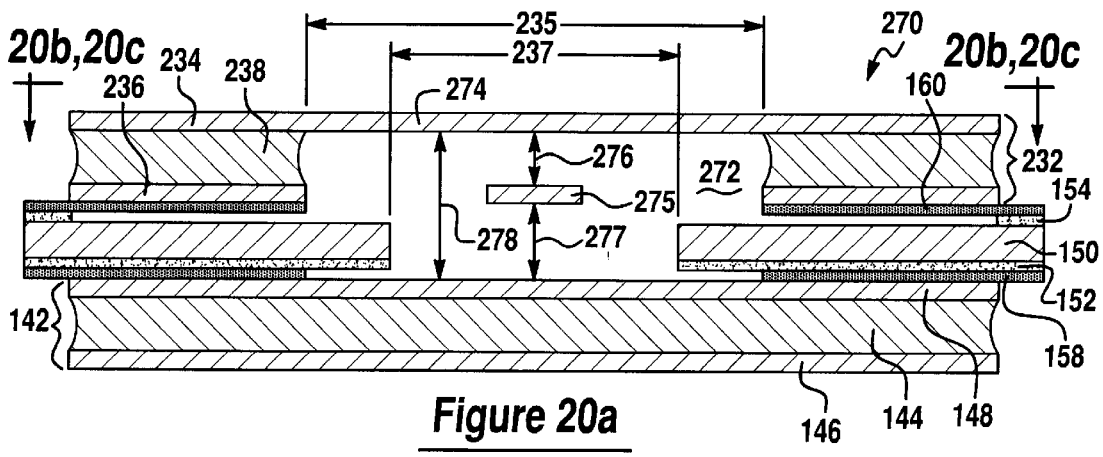
FIG. 20a is a sectional side view of a multi-layer circuit board including a "blind" via or cavity which is formed in accordance with the teachings of a twentieth embodiment of the invention.
Figure 20B:
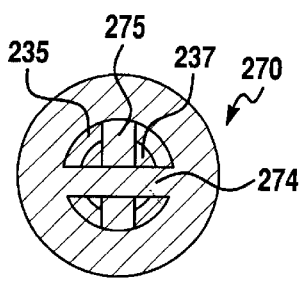
Figure 20C:
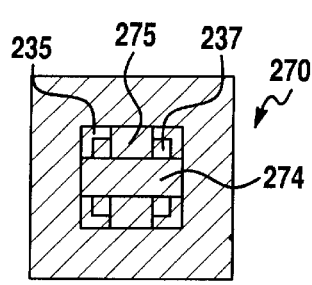

Referring now to FIGS. 20*a*–20*c*, there is shown a circuit assembly 270 made in accordance with the teachings of a twentieth embodiment of the invention. Circuit assembly 270 is substantially identical to circuit assembly 230 with the exception that notch or blind via 240 has been replaced with notch or blind via 272. In this non-limiting embodiment, portions of conductive layer 234, 236 have been removed from portion or region 235, while "crossover" portions or "bridges" 274, 275 (e.g., those portions of layers 234, 236 not removed) remain substantially and horizontally "suspended" within region 235. The bridges 274, 275 improve solder wetting within the blind via 272. Particularly, the gaps 276, 277, 278 which are formed between bridge 274 and bridge 275 and between bridges 274, 275 and pre-circuit assembly 142 attract and "draw in" fluids such as molten solder, thereby promoting the joining and/or connection of pre-circuit assemblies 142, 232.

In one non-limiting embodiment, which is illustrated in FIG. 20*b*, area or region 235 is generally circular shaped with a diameter of approximately 0.050 inches, and area or region 237 is generally circular shaped with a diameter of approximately 0.040 inches, and bridges 274, 275 are generally rectangular and traverse region 235. In another non-limiting embodiment, which is illustrated in FIG. 20*c*, area or region 235 is generally square shaped having a length and a width of approximately 0.050 inches, and area 237 is also generally square shaped having a length and a width of approximately 0.040 inches and bridges 274, 275 are generally rectangular and traverse region 235.

Figure 21A:
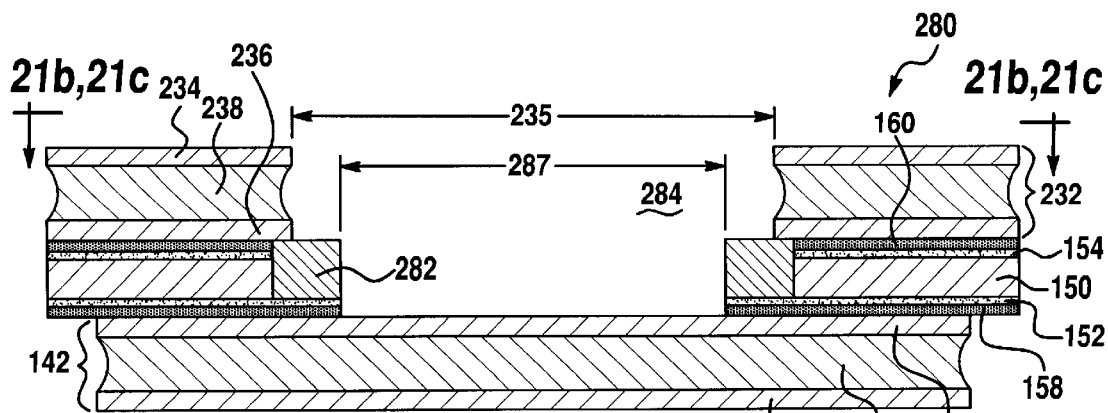
FIG. 21a is a sectional side view of a multi-layer circuit board including a "blind" via or cavity which is formed in accordance with the teachings of a twenty-first embodiment of the invention.
Figure 21B:
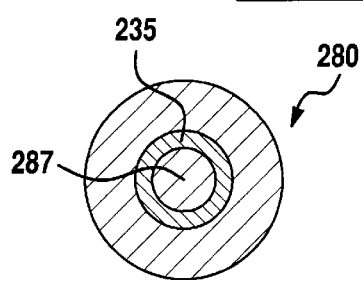
Figure 21C:
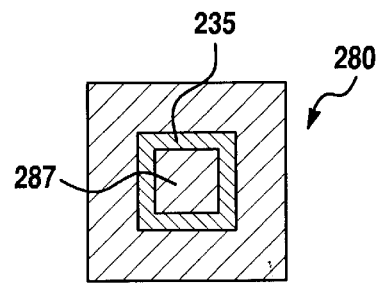

Referring now to FIGS. 21*a*–21*c*, there is shown a circuit assembly 280 made in accordance with the teachings of a twenty-first embodiment of the invention. Circuit assembly 280 is substantially Identical to circuit assembly 230 with the exception that certain portions of member 150, adhesive materials 158, 160, and dielectric materials 152, 154 have been removed from area or region 235 of the circuit assembly 280 in a known and conventional manner such as by drilling, punching and/or selective etching and a solder mask 282 with a substantially rectangular cross-section has been attached, coupled and/or adhered to member 150, adhesive material 160 and dielectric materials 152, 154 to define a newly shaped via or notch 284. In one non-limiting embodiment, solder mask 282 is manufactured and/or formed from a known and conventional masking material such that mask 282 prevents solder from traveling down trace lines (i.e. spaces or lines that exist between different layers, materials, and or members of a circuit board) within assembly 200 and such that mask 282 inhibits electrical signals which are transmitted from assemblies 142, 232 from being communicated to core member 150. Additionally, the portions or layers 234, 236 and 238 cooperatively form an annular "pad" or ring, which operatively holds or retains, solder within cavity 284.

In one non-limiting embodiment, which is illustrated in FIG. 21*b*, area or region 235 is generally circular shaped with a diameter of approximately 0.050 inches and area or region 287 is also generally circular shaped as defined by the solder mask 282 and has a diameter of approximately 0.040 inches. In another non-limiting embodiment, which is illustrated in FIG. 21*c*, area or region 235 is generally square shaped having a length and a width of approximately 0.050 inches and area 287 is also generally square shaped as defined by solder mask 282 and has a length and a width of approximately 0.040 inches.

Figure 22A:
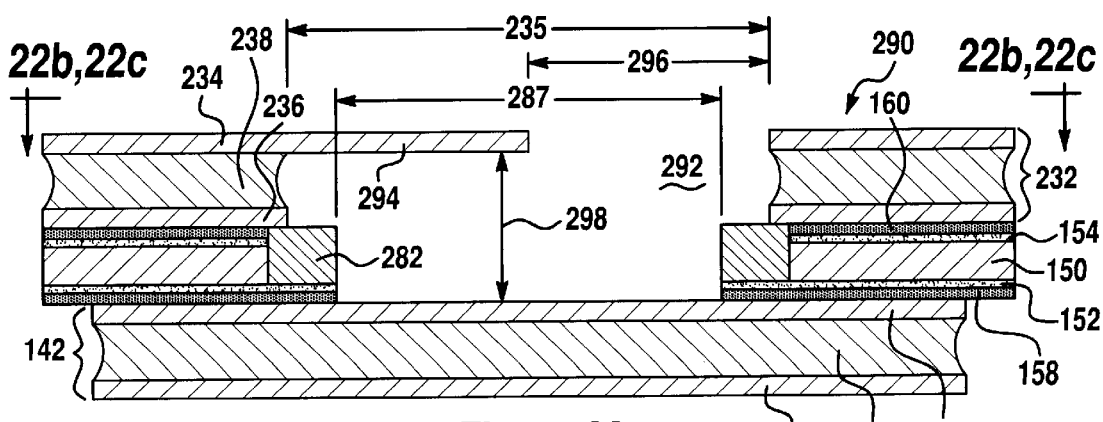
FIG. 22a is a sectional side view of a multi-layer circuit board including a "blind" via or cavity which is formed in accordance with the teachings of a twenty-second embodiment of the invention.
Figure 22B:
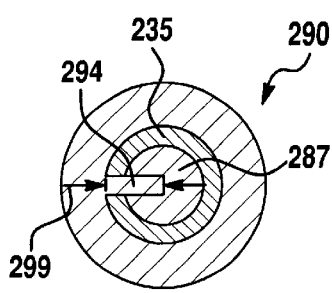
Figure 22C:
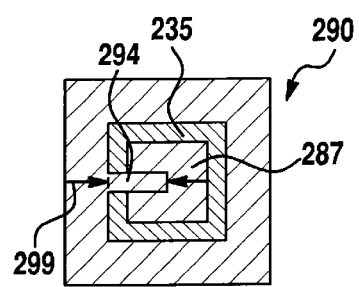

Referring now to FIGS. 22*a*–22*c*, there is shown a circuit assembly 290 made in accordance with the teachings of a twenty-second embodiment of the invention. Circuit assembly 290 is substantially identical to circuit assembly 280 with the exception that notch or blind via 284 has been replaced with notch or blind via 292. In this non-limiting embodiment, a portion of electrically conductive member 234 has been removed from a region 296 which is disposed within region 235, while a portion, "tab", or protrusion 294 (e.g., that portion of member 234 not removed) remains substantially and horizontally "suspended" and/or extending within region 235. The protrusion 294 improves solder wetting within the blind via 292. Particularly, the gap 298 which is formed between protrusion 294 and the pre-circuit assembly 142 is effective to attract and/or "draw in" fluids such as molten solder, thereby promoting the joining and/or connection of conductive layer 294 and pre-circuit assembly 142.

In one non-limiting embodiment, which is illustrated in FIG. 22b, area or region 235 is generally circular shaped with a diameter of approximately 0.050 inches, area or region 287 is generally circular shaped with a diameter of approximately 0.040 inches as defined by solder mask 282, and protrusion 294 is generally rectangular and has a length 299 of approximately 0.025 inches. In another non-limiting embodiment, which is illustrated in FIG. 22c, area or region 235 is generally square shaped with a length and a width of approximately 0.050 inches, and area or region 287 is also generally square shaped as defined by solder mask 282 and protrusion 294 is generally rectangular and has length 299 of approximately 0.025 inches.

Figure 23A:
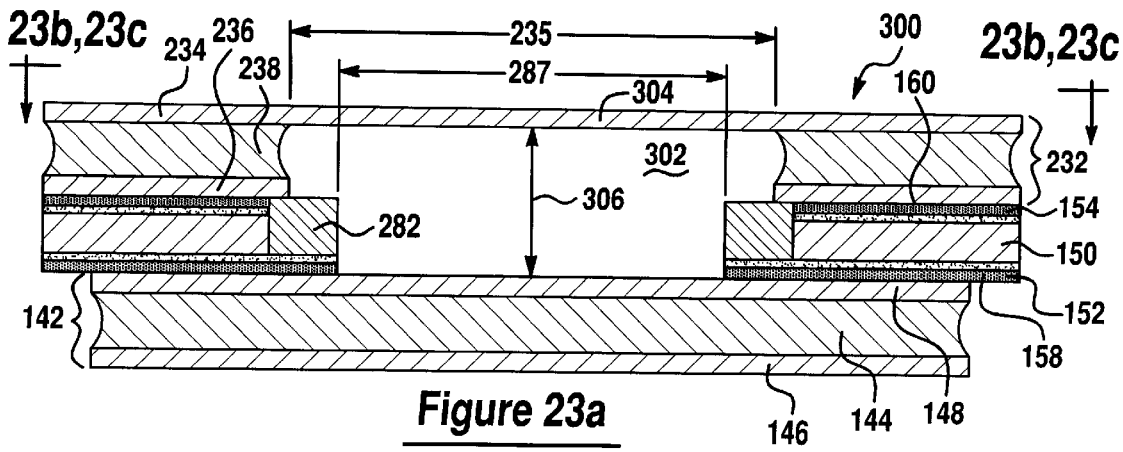
FIG. 23a is a sectional side view of a multi-layer circuit board including a "blind" via or cavity which is formed in accordance with the teachings of a twenty-third embodiment of the invention.
Figure 23B:
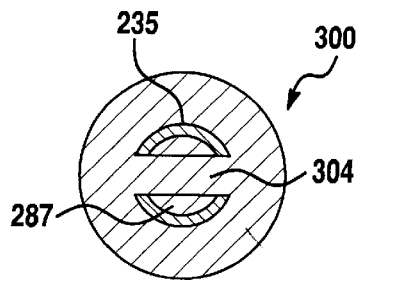
Figure 23C:
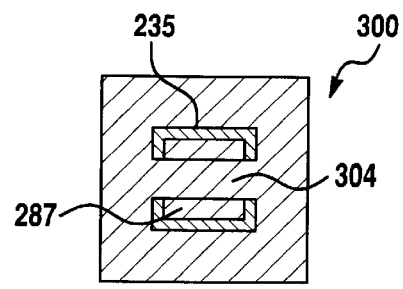

Referring now to FIGS. 23a–23c, there is shown a circuit assembly 300 made in accordance with the teachings of a twenty-third embodiment of the invention. Circuit assembly 300 is substantially identical to circuit assembly 280 with the exception that notch or blind via 284 has been replaced with notch or blind via 302. In this non-limiting embodiment, a portion of electrically conductive member 234 has been removed from portion or region 235, while a "crossover" portion or "bridge" 304 (e.g., that portion of member 234 not removed) remains substantially and horizontally "suspended" within region 235. The bridge 304 improves solder wetting within the blind via 302. Particularly, the gap 306 which is formed between "bridge" 304 and pre-circuit assembly 142 attracts and "draws in" fluids such as molten solder, thereby promoting the joining and/or connection of pre-circuit assembly 142 with conductive layer 234.

In one non-limiting embodiment, which is illustrated in FIG. 23b, area or region 235 is generally circular shaped with a diameter of approximately 0.050 inches, and area or region 287 is also generally circular shaped as defined by solder mask 282 with a diameter of approximately 0.040 inches and bridge 304 is generally rectangular and traverses region 235. In another non-limiting embodiment, which is illustrated in FIG. 23c, area or region 235 is generally square shaped having a length and a width of approximately 0.050 inches and area or region 287 is also generally square shaped as defined by solder mask 282, and bridge 304 is generally rectangular and traverses region 235.

Figure 24A:
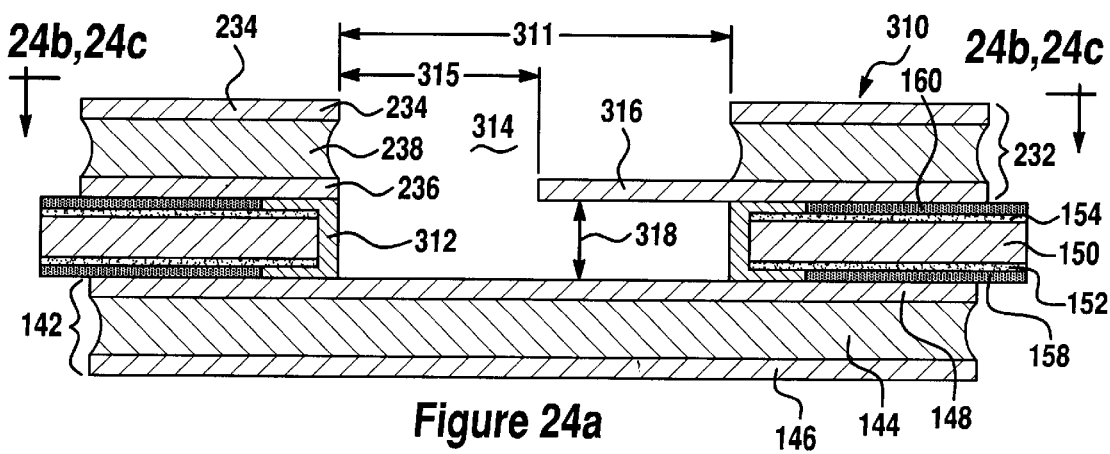
FIG. 24a is a sectional side view of a multi-layer circuit board including a "blind" via or cavity which is formed in accordance with the teachings of a twenty-fourth embodiment of the invention.
Figure 24B:
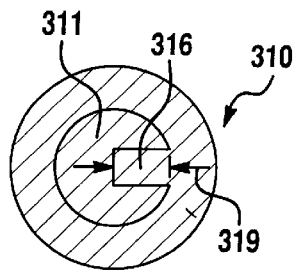
Figure 24C:
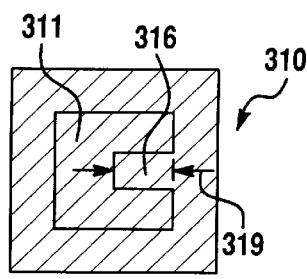

Referring now to FIGS. 24a–24c, there is shown a circuit assembly 310 made in accordance with the teachings of a twenty-fourth embodiment of the invention. Circuit assembly 310 is substantially identical to circuit assembly 280 with the exception that certain portions of pre-circuit assembly 232 member 150 adhesive materials 158, 160, and dielectric materials 152, 154 have been removed from area or region 311 of the circuit assembly 280 in a known and conventional manner such as by drilling, punching and/or selective etching and a solder mask 312 with a generally "U"-shaped cross-section has been attached, coupled and/or adhered to member 150, adhesive materials 158, 160 and dielectric materials 152, 154 to define a newly shaped via or notch 314. In one non-limiting embodiment, solder mask 312 is manufactured and/or formed from a known and conventional masking material such that mask 312 prevents solder from traveling down trace lines (i.e. spaces or lines that exist between different layers, materials, and or members of a circuit board) within assembly 310 and such that mask 312 inhibits electrical signals which are transmitted from assemblies 142, 232 from being communicated to core member 150. Further, in this non-limiting embodiment, a certain portion of electrically conductive member 236 has been removed from a region 315 which is disposed within region 311, while a portion, "tab", or protrusion 316 (e.g., that portion of member 236 not removed) remains substantially and horizontally "suspended" and/or extending within region 311. The protrusion 316 improves solder wetting within the blind via 314. Particularly, the gap 318 which is formed between protrusion 316 and the pre-circuit assembly 142 is effective to attract and/or "draw in" fluids such as molten solder, thereby promoting the joining and/or connection of pre-circuit assembly 232 and pre-circuit assembly 142.

In one non-limiting embodiment, which is illustrated in FIG. 24b, area or region 162 is generally circular shaped with a diameter of approximately 0.050 inches as at least partially defined by the solder mask 312 and protrusion 316 is generally rectangular with a length 319 of approximately 0.025 inches. In another non-limiting embodiment, which is illustrated in FIG. 24c, area or region 311 is generally square shaped with a length and a width of approximately 0.050 inches as at least partially defined by solder mask 312 and protrusion 316 is generally rectangular with a length 319 which is approximately 0.025 inches.

Figure 25A:
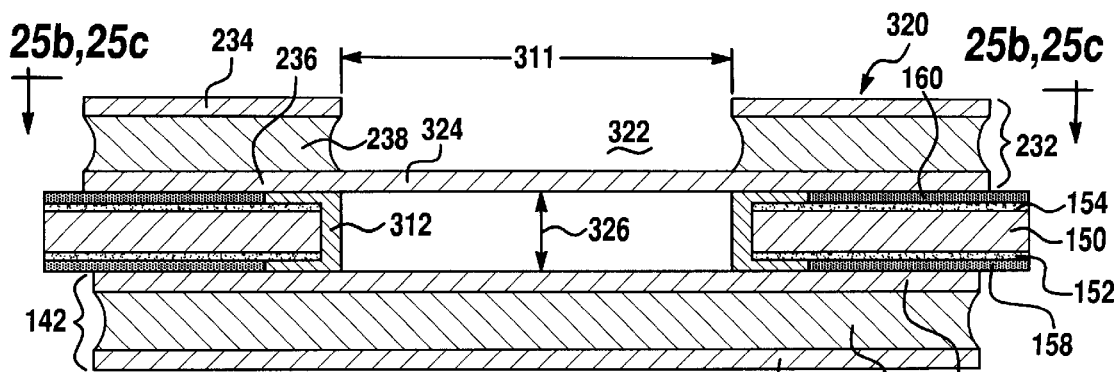
FIG. 25a is a sectional side view of a multi-layer circuit board including a "blind" via or cavity which is formed in accordance with the teachings of a twenty-fifth embodiment of the invention.
Figure 26A:
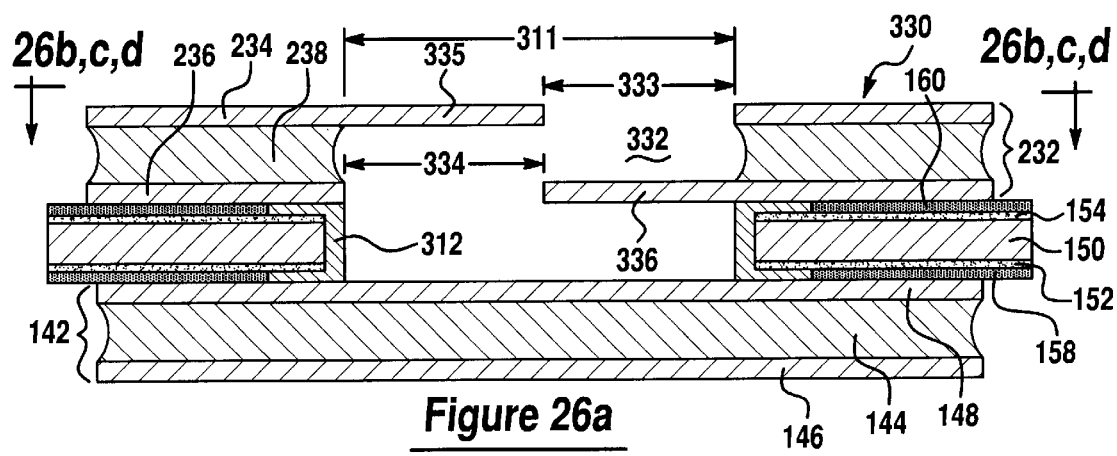
FIG. 26a is a sectional side view of a multi-layer circuit board including a "blind" via or cavity which is formed in accordance with the teachings of a twenty-sixth embodiment of the invention.

Referring now to FIGS. 25a–25c, there is shown a circuit assembly 320 made in accordance with the teachings of a twenty-fifth embodiment of the invention. Circuit assembly 320 is substantially identical to circuit assembly 310 with the exception that notch or blind via 314 has been replaced with notch or blind via 322. In this non-limiting embodiment, a portion of conductive layer 236 has been removed from portion or region 311, while a "crossover" portion or "bridge" 324 (e.g., that portion of layer 236 not removed) remains substantially and horizontally "suspended" within region 311. The bridge 324 improves solder wetting within the blind via 322. Particularly, the gap 326 which is formed between "bridge" 324 and the pre-circuit assembly 142 attracts and "draws in" fluids such as molten solder, thereby promoting the joining and/or connection of pre-circuit assemblies 142, 232.

In one non-limiting embodiment, which is illustrated in FIG. 25b, area or region 311 is generally circular shaped as partially defined by solder mask 312 with a diameter of approximately 0.050 inches and bridge 324 is generally rectangular and traverses region 311. In another non-limiting embodiment, which is illustrated in FIG. 25c, area or region 311 is generally square shaped as partially defined by solder mask 312 with a length and a width of approximately 0.050 inches and bridge 324 is generally rectangular and traverses region 311.

Referring now to FIGS. 26a–26d, there is shown a circuit assembly 330 made in accordance with the teachings of a twenty-sixth embodiment of the invention. Circuit assembly 330 is substantially identical to circuit assembly 310 with the exception that notch or blind via 314 has been replaced with notch or blind via 332. In this non-limiting embodiment, portions of electrically conductive members 234, 236 have been respectively removed from regions 333, 334 which are disposed within region 311, while portions, "tabs", or protrusions 335, 336 (e.g., those portions of members 234, 236 not removed) remain substantially and horizontally "suspended" and/or extending within region 311 or cavity 332. The protrusions 335, 336 improve solder wetting within the blind via 332. Particularly, the gaps which are formed between the respective protrusions 335, 336 and the circuit assembly 142 attract and/or "draw in" fluids such as molten solder, thereby promoting the joining and/or connection of circuit assemblies 232, 142.

In one non-limiting embodiment, which is illustrated in FIG. 26b, area or region 311 is generally circular shaped as defined by solder mask 312 and has a diameter of approximately 0.050 inches. Protrusions 335, 336 are each generally rectangular and have a substantially identical length 339 of approximately 0.025 inches. In another non-limiting embodiment, which is illustrated in FIG. 26c, area or region 311 is generally circular shaped as partially defined by solder mask 312 and has a diameter of approximately 0.050 inches. In this non-limiting embodiment, protrusions 335, 336 are generally triangular in shape, and a third generally triangular "tab" or protrusion 337 is formed within conductive layer 234 or 236 and extends into portion 311. In still another non-limiting embodiment, which is illustrated in FIG. 26d, area or region 311 is generally square shaped as partially defined by solder mask 312 with a length and a width of approximately 0.050 inches. In this non-limiting embodiment, protrusions 335 and 336 are generally rectangular in shape and have a length 339 of approximately 0.025 inches.

Referring now to FIGS. 27a–27d, there is shown a circuit assembly 340 made in accordance with the teachings of a twenty-seventh embodiment of the invention. Circuit assembly 340 is substantially identical to circuit assembly 310 with the exception that notch or blind via 314 has been replaced with notch or blind via 342. In this non-limiting embodiment, a "crossover" portion or "bridge" 343 (e.g., that portion of member 234 not removed) remains substantially and horizontally "suspended" within region 311. Also, in this non-limiting embodiment, a second "crossover" portion or "bridge" 344 (e.g., that portion of member 236 not removed) remains substantially and horizontally "suspended" within region 311. The bridges 343, 344 improve solder wetting within the blind via 342. Particularly, the gaps 345, 346 and 347 which are formed between "bridge" 343, "bridge" 344 and the pre-circuit assembly 142 attract and "draws in" fluids such as molten solder, thereby promoting the joining and/or connection of conductive layers 343, 344 and pre-circuit assembly 142.

Figure 27A:
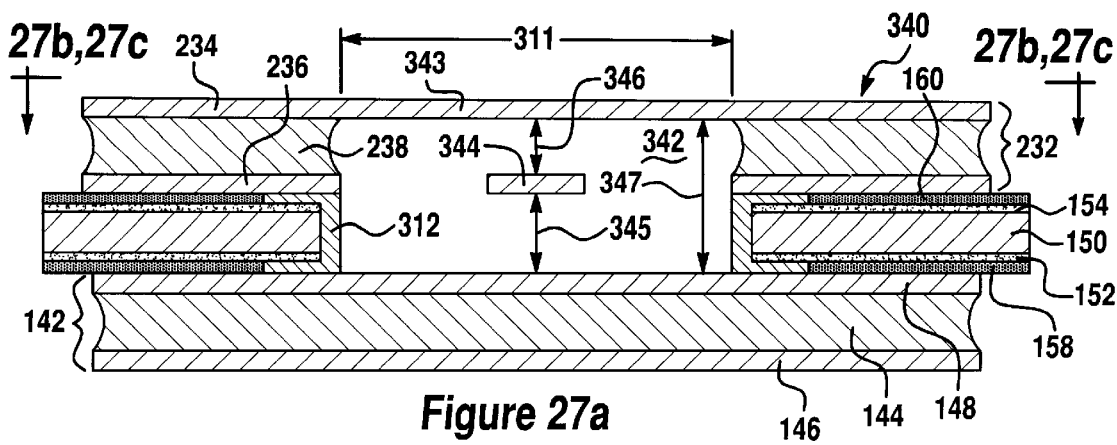
FIG. 27a is a sectional side view of a multi-layer circuit board including a "blind" via or cavity which is formed in accordance with the teachings of a twenty-seventh embodiment of the invention.
Figure 27B:
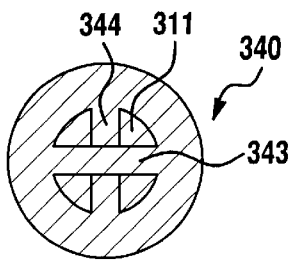
Figure 27C:
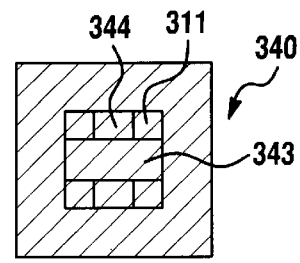

In one non-limiting embodiment, which is illustrated in FIG. 27b, area or region 311 is generally circular shaped as partially defined by solder mask 312 and has a diameter of approximately 0.050 inches, and bridges 343, 344 are generally rectangular and traverse region 311. In another non-limiting embodiment, which is illustrated in FIG. 27c, area or region 311 has a generally square shape as partially defined by solder mask 312 with a length and a width of approximately 0.050 inches, and bridges 343, 344 are generally rectangular and traverse region 311.

Figure 28A:
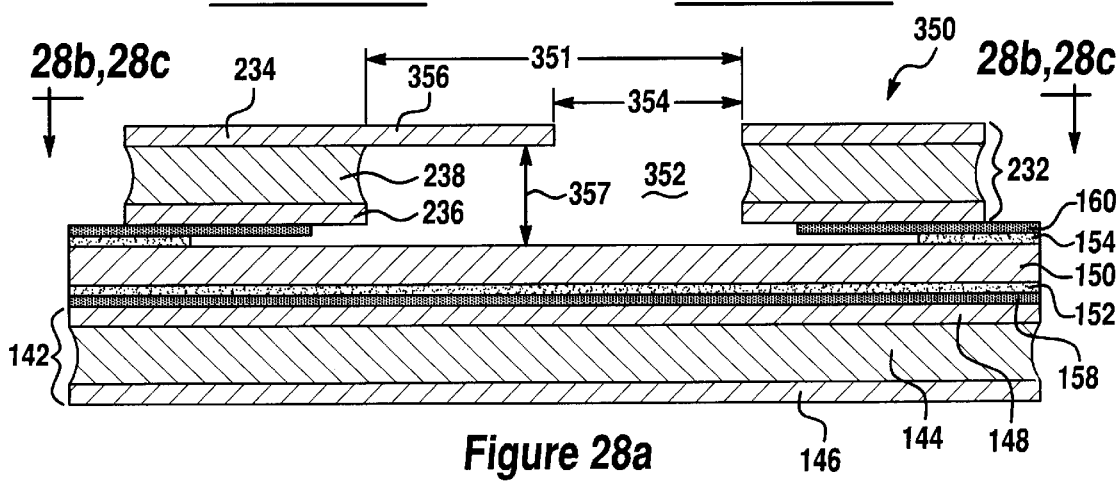
FIG. 28a is a sectional side view of a multi-layer circuit board including a "blind" via or cavity which is formed in accordance with the teachings of a twenty-eighth embodiment of the invention.
Figure 28B:
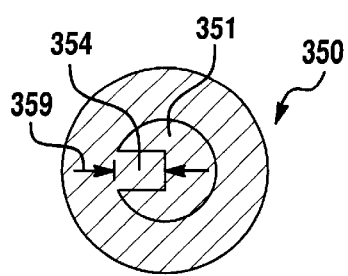
Figure 28C:
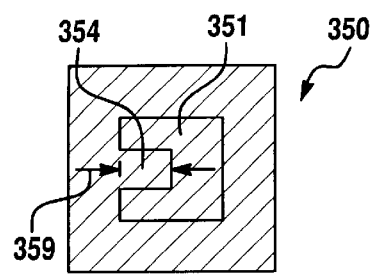

Referring now to FIGS. 28a–28c, there is shown a circuit assembly 350 made in accordance with the teachings of a twenty-eighth embodiment of the invention. Circuit assembly 350 is substantially identical to circuit assembly 230 with the exception that only certain portions of pre-circuit assembly 232, adhesive material 160 and dielectric material 154 have been removed from area or region 351 of the circuit assembly 350 in a known and conventional manner such as by drilling, punching and/or selective etching to form a new notch or blind via 352. Further, in this non-limiting embodiment, a portion of electrically conductive member 234 has been removed from a region 354 which is disposed within region 351, while a portion, "tab", or protrusion 356 (e.g. that portion of member 234 not removed) remains substantially and horizontally "suspended" and/or extending within region 351. The protrusion 356 improves solder wetting within the blind via 352. Particularly, the gap 357 which is formed between protrusion 356 and the conductive member 150 is effective to attract and/or "draw in" fluids such as molten solder, thereby promoting the joining and/or connection of pre-circuit assembly 232 and conductive member 150.

In one non-limiting embodiment, which is illustrated in FIG. 28b, area or region 351 has a generally circular shape with a diameter of approximately 0.050 inches and protrusion 354 has a length 359 of approximately 0.025 inches. In another non-limiting embodiment, which is illustrated in FIG. 28c, area or region 351 is generally square shaped with a length and a width of approximately 0.050 inches and protrusion 354 has a length 359 of approximately 0.025 inches.

Figure 29A:
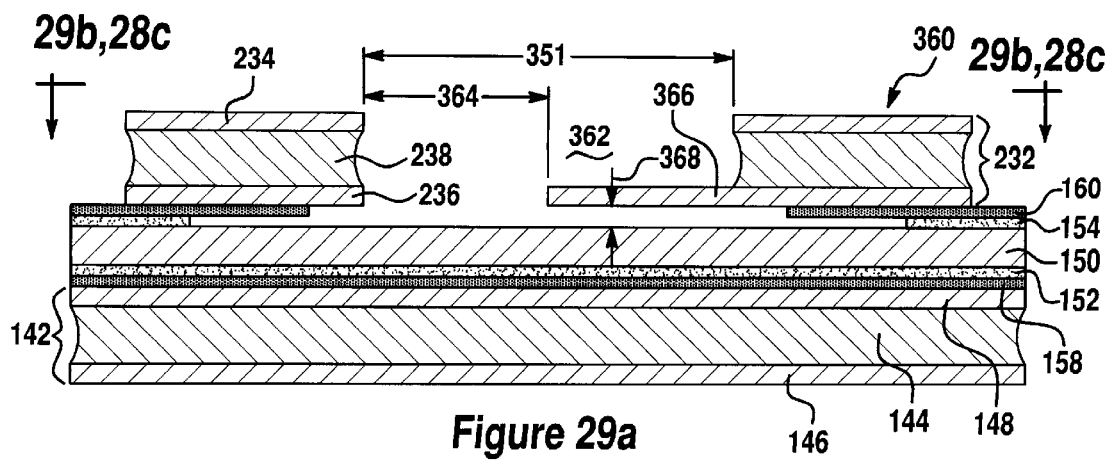
FIG. 29a is a sectional side view of a multi-layer circuit board including a "blind" via or cavity which is formed in accordance with the teachings of a twenty-ninth embodiment of the invention.
Figure 29B:
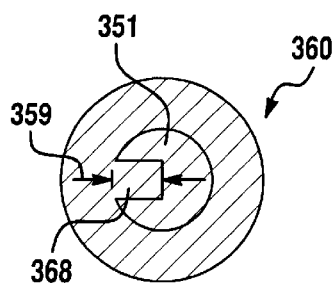
Figure 29C:
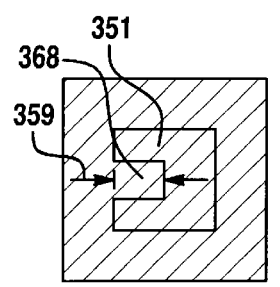

Referring now to FIGS. 29a–29c, there is shown a circuit assembly 360 made in accordance with the teachings of a twenty-ninth embodiment of the invention. Circuit assembly 360 is substantially identical to circuit assembly 350 with the exception that via or aperture 352 has been replaced with via or aperture 362. In this non-limiting embodiment, a portion of electrically conductive member 236 has been removed from a region 364 which is disposed within region 351, while a portion, "tab", or protrusion 366 (e.g., that portion of member 236 not removed) remains substantially and horizontally "suspended" and/or extending within region 351. The protrusion 366 improves solder wetting within the blind via 362. Particularly, the gap 368 which is formed between protrusion 366 and the conductive member 150 is effective to attract and/or "draw in" fluids such as molten solder, thereby promoting the joining and/or connection of pre-circuit assembly 232 and conductive member 150.

In one non-limiting embodiment, which is illustrated in FIG. 29b, area or region 351 has a generally circular shape with a diameter of approximately 0.050 inches and protrusion 366 has a length 369 of approximately 0.025 inches. In another non-limiting embodiment, which is illustrated in FIG. 29c, area or region 351 has a generally square shape with a length and a width of approximately 0.050 inches and protrusion 366 has a length of approximately 0.025 inches.

Figure 30A:
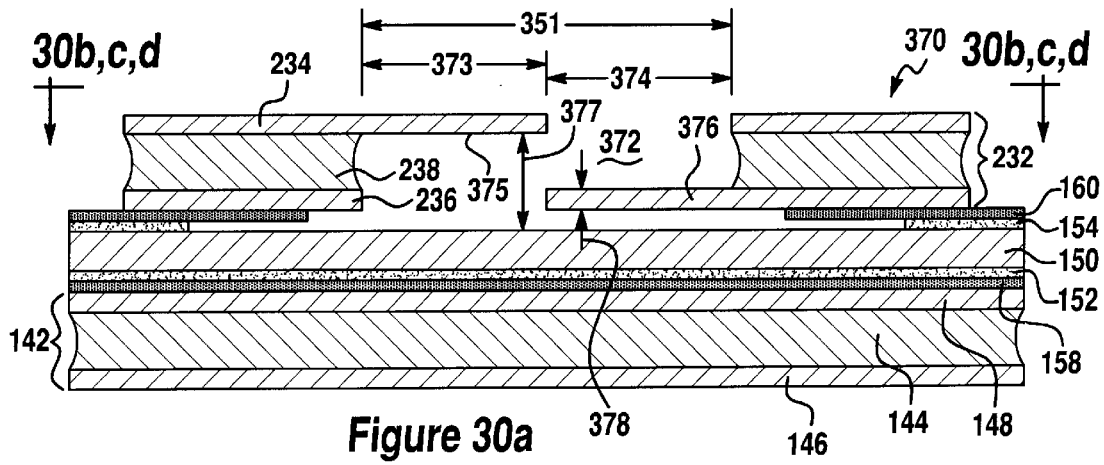
FIG. 30a is a sectional side view of a multi-layer circuit board including a "blind" via or cavity which is formed in accordance with the teachings of a thirtieth embodiment of the invention.
Figure 30B:
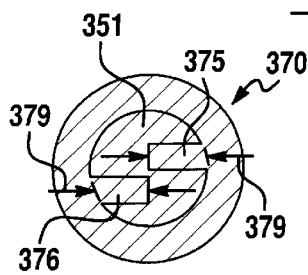
Figure 30C:
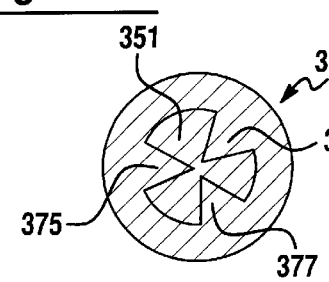

Referring now to FIGS. 30a–30c, there is shown a circuit assembly 370 made in accordance with the teachings of a thirtieth embodiment of the invention. Circuit assembly 370 is substantially identical to circuit assembly 350 with the exception that notch or blind via 352 has been replaced with notch or blind via 372. In this non-limiting embodiment, portions of electrically conductive members 234, 236 have been respectively removed from regions 373, 374 which are disposed within region 351, while portions, "tabs", or protrusions 375, 376 (e.g., those portions of members 234, 236 not removed) remain substantially and horizontally "suspended" and/or extending within region 351 or cavity 372. The protrusions 375, 376 improve solder wetting within the blind via 372. Particularly, the gaps 377, 378 which are formed between the respective protrusions 375, 376 and the conductive member 150 attract and/or "draw in" fluids such as molten solder, thereby promoting the joining and/or connection of circuit assembly 232 and conductive member 150.

Figure 30D:
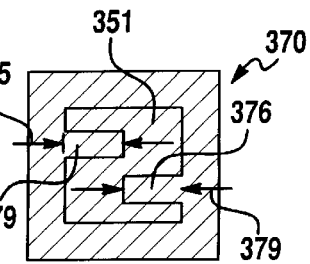

In one non-limiting embodiment, which is illustrated in FIG. 30b, area or region 351 is generally circular shaped and has a diameter of approximately 0.050 inches. Protrusions 375, 376 are each generally rectangular and have a substantially identical length 379 of approximately 0.025 inches. In another non-limiting embodiment, which is illustrated in FIG. 30c, area or region 351 is generally circular shaped and has a diameter of approximately 0.050 inches. In this non-limiting embodiment, protrusions 375, 376, are generally triangular in shape, and a third generally triangular "tab" or protrusion 371 is formed within material layer 234 or 236 and extends into portion 351. In another non-limiting embodiment, which is illustrated in FIG. 30d, area or region 351 is generally square shaped having a length and a width of approximately 0.050 inches. In this non-limiting embodiment, protrusions 375 and 376 are generally rectangular in shape and have a length of approximately 0.025 inches.

It should further be realized that any of the above-described "blind" vias or cavities and/or circuit portions may be concomitantly processed on multiple portions of a single circuit board assembly and may be selectively interchanged in any number of desired arrangements or circuit board formation strategies. Furthermore, any of the above-described blind vias or cavities allow the circuit board portion or panel on which they are formed to be operatively positioned on a conventional vacuum plate effective to retain or "hold down" those portions during processing.

In alternate embodiments, small holes (i.e., holes much smaller than the above-described blind vias or cavities) are conventionally drilled or formed through the entire board assembly, and are located in the center of symmetry of the above-described blind vias. These small holes allow air and gasses to escape from the blind vias during processing.

In other alternate embodiments, the above-described circuit board portions may be coated with a solderable surface finish such as an organic solder protectorant coating (e.g., benzotriazole or imidizole), tin, silver or gold. Additionally, solder masks can be used to better define the geometry of the circuit board portions and structures and to prevent solder from traveling down trace lines.

It should be understood that the invention is not limited to the exact embodiment or construction which has been illustrated and described but that various changes may be made without departing from the spirit and the scope of the invention.

What is claimed is:

1. A circuit board comprising:
   a first electrically conductive member having a first and a second surface, having a first aperture with a first interior surface, and having a second aperture with a second interior surface;
   adhesive material which is applied upon certain portion of said first and second surfaces, and which is applied upon said first interior surface of said first aperture;
   a first circuit assembly having at least a second electrically conductive member which is coupled to said adhesive material resident upon said first surface of said first electrically conductive member, said first circuit assembly further including at least a third electrically conductive member and a first core member which is contained between at least said second and at least said third electrically conductive members and which includes at least one air-bridge;
   a second circuit assembly having at least a fourth electrically conductive member which is coupled to said adhesive material resident upon said second surface of said first electrically conductive member, said second circuit assembly further including at least a fifth electrically conductive member and a second core member which is contained between at least said fourth and at least said fifth electrically conductive members;
   a layer of dielectric material which is applied to at least said first circuit assembly; and
   at least a sixth electrically conductive member which is disposed within said layer of dielectric material.

2. A circuit board assembly as in claim 1 wherein said first circuit portion includes a protrusion which extends into said blind via and which is effective to draw in fluids which are selectively inserted into said blind via.

3. A circuit board assembly as in claim 1 wherein said first circuit portion includes a bridge which traverses said blind via and which is effective to draw in fluids which are selectively inserted into said blind via.

4. A circuit board assembly as in claim 1 wherein said first circuit portion comprises a pre-circuit assembly including a pair of electrically conductive members and a core metal member disposed between said electrically conductive members.

5. A circuit board assembly as in claim 4 wherein at least one of said electrically conductive members includes a protrusion which extends into said blind via.

6. A circuit board assembly comprising:
   a pre-circuit assembly having first and second electrically conductive members and a core metal member which is disposed between said first and second electrically conductive members;
   a core portion including an electrically conductive core member which is disposed between a first layer of dielectric material and a second layer of dielectric material, said core portion being connected to said pre-circuit assembly by a first layer of adhesive; and
   a third electrically conductive member connected to said core portion by a second layer of adhesive;
   wherein certain portions of said core member, said third electrically conductive member, said adhesive layers and said dielectric material layers have been removed to form a blind via within said circuit board assembly and an annular pad which surrounds said blind via.

7. A method for making a circuit board comprising the steps of:
   providing a first electrically conductive member;
   providing a first assembly having a core member upon which a second electrically conductive member and a third electrically conductive member is disposed;
   forming at least one aperture within said first electrically conductive member, said at least one aperture having a first interior surface;
   placing a first layer of dielectric material upon said first interior surface and upon said first electrically conductive member;
   coupling said third electrically conductive member to said first layer of dielectric material;
   removing a portion of said core member, thereby forming at least one electrically conductive air bridge by use of said second electrically conductive member;
   placing a second layer of dielectric material upon said first assembly;
   placing a fourth electrically conductive member upon said second layer of dielectric material; and
   coupling said third electrically conductive member to said at least one air-bridge, thereby forming a circuit board.

8. A circuit board assembly as in claim 6 wherein said third electrically conductive member is a component of a second pre-circuit assembly, said second pre-circuit assembly including a second core metal member and a fourth electrically conductive member.

9. A circuit board assembly as in claim 8 wherein said fourth electrically conductive member includes a protrusion which extends into said blind via and which is effective to draw in liquid materials which are selectively inserted into said blind via.

10. A circuit board assembly as in claim 8 wherein said fourth electrically conductive member includes a bridge which traverses said blind via and which is effective to draw in liquid materials which are selectively inserted into said blind via.

11. The method of claim 7 further comprising the steps of:
providing a second assembly having a core member upon which a fifth electrically conductive member is disposed;
coupling said fifth electrically conductive member upon said first layer of dielectric material resident upon said first electrically conductive member;
placing a third layer of dielectric material upon said second assembly;
forming an aperture within said third layer of dielectric material which terminates upon said fifth electrically conductive member; and
electroplating said aperture.

12. A method for making a circuit board comprising the steps of:
providing a first electrically conductive member having a first and a second surface;
forming a first aperture within said first electrically conductive member having a first interior surface;
forming a second aperture within said first electrically conductive member having a second interior surface;
selectively applying a dielectric material to said first and second surfaces of said first electrically conductive member and to said first interior surface of said first aperture, thereby forming a first pre-circuit assembly;
providing a second pre-circuit assembly having a first core member including a first surface and a second surface, said second pre-circuit assembly further having at least one second electrically conductive member disposed upon said first surface of said first core member and having at least one third electrically conductive member disposed upon said second surface of said first core member;
providing a third pre-circuit assembly having a second core member including a first surface and a second surface, said third pre-circuit assembly having at least one fourth electrically conductive member disposed upon said first surface of said second core member and having at least one fifth electrically conductive member disposed upon said second surface of said second core member;
selectively attaching said second pre-circuit assembly to said first pre-circuit assembly by attaching said at least one third electrically conductive member to said dielectric material which is resident upon said first surface of said first electrically conductive member;
selectively attaching said third pre-circuit assembly to said first pre-circuit assembly by attaching said at least one fourth electrically conductive member to said dielectric material which is resident upon said second surface of said first electrically conductive member;
selectively applying a certain etchant material to said first and second core members, effective to remove certain portions of said first and second core members, thereby forming at least one air-bridge within said second pre-circuit assembly and at least one second air-bridge within said third pre-circuit assembly;
applying a second dielectric material upon said second and third pre-circuit assemblies, effective to cover said at least one second, at least one third, at least one fourth, and at least one fifth electrically conductive members and to underfill said at least one air-bridge and said at least one second air-bridge;
forming apertures by selectively removing certain portions of said second dielectric material, wherein said apertures selectively expose certain portions of said at least one second, at least one fourth, and at least one fifth electrically conductive members and said at least one first air-bridge and said at least one second air bridge;
placing an electrically conductive material upon said first, second, and third pre-circuit assemblies, thereby covering portions of said dielectric material which reside within said first aperture and portions of said first electrically conductive member which reside within said second aperture, covering said second dielectric material, and covering said certain exposed portions of said at least one second, at least one fourth, and at least one fifth electrically conductive members;
selectively removing certain portions of said electrically conductive material which reside upon said second dielectric material, thereby exposing a certain portion of said second dielectric material; and
selectively applying a solder mask material upon said second dielectric and upon certain portions of said electrically conductive material, thereby forming a circuit board assembly.

13. A method for making a circuit board as in claim 12 wherein said removal of said first electrically conductive member is effective to form a protrusion which extends into said blind via.

14. A method for making a circuit board as in claim 12 wherein said removal of said first electrically conductive member is effective to form a bridge which traverses said blind via.

15. A method for making a circuit board as in claim 12 wherein said first electrically conductive member is a component of a first pre-circuit assembly and wherein a portion of said first pre-circuit assembly is removed to form an annular ring around said blind via.

16. The method of claim 12 wherein said second dielectric material structurally supports said at least one air-bridge.

17. The method of claim 12 wherein said step of forming apertures by selectively removing certain portions of said second dielectric material comprises forming at least one aperture within said second dielectric material and the step of placing a certain electrically conductive material upon said first, second, and third pre-circuit assemblies comprises applying said electrically conductive material within said at least one aperture within said second dielectric material.

18. The method of claim 17 wherein said step of applying a solder mask material comprises applying said solder mask material within said apertures within said second dielectric material.

19. The circuit board assembly of claim 1 further comprising an amount of solder material which is disposed within said annular ring and which communicatively couples said first circuit portion to said core member.

20. The circuit board assembly of claim 19 wherein said annular ring has a diameter of about 0.05 inches.

21. The circuit board assembly of claim 1 wherein said layer of adhesive material comprises a Z-flex adhesive material.

22. A circuit board assembly comprising:

an electrically conductive core member having a top surface and a bottom surface;

a first layer of dielectric material which is applied to said top surface of said electrically conductive core member and which substantially covers all of said top surface;

a second layer of dielectric material which is applied to said bottom surface of said electrically conductive core member and which substantially covers all of said top surface;

a layer of adhesive material which a disposed upon said first layer of dielectric material and which substantially covers all of said first layer of dielectric material;

a first circuit portion connected to said first layer of dielectric material by said layer of adhesive material; and a generally square via which is integrally formed within said first circuit portion, said layer of adhesive material, and said first layer of dielectric material and which forms a blind via within said circuit board assembly which extends to said core member.

23. The circuit board assembly of claim 22 further comprising an amount of solder material which is disposed within said generally square via and which communicatively couples said first circuit portion to said core member.

24. The circuit board assembly of claim 23 wherein said generally square via has a length of about 0.05 inches and a width of about 0.05 inches.

25. The circuit board assembly of claim 22 wherein said layer of adhesive comprises a Z-flex adhesive material.

26. A method for forming a circuit board assembly, said method comprising the steps of:

providing an electrically conductive core member having a top and a bottom surface;

applying a pair of layers of dielectric material upon said core member, wherein each of said top and bottom surfaces receives a unique one of said pair of layers of dielectric material;

providing a conductive circuit portion;

coupling said circuit portion to said applied layer of dielectric material which is disposed upon said top surface of said core member by placing a layer of adhesive material upon said top surface applied layer of dielectric material;

forming a via having a certain shape through said circuit portion, said layer of adhesive material; and said top surface applied layer of dielectric material, thereby exposing said core member; and inserting an amount of solder material within said via to electrically couple said circuit portion with said core member.

27. The method of claim 26 wherein said certain shape of said via is an annular ring.

28. The method of claim 26 wherein said certain shape of said via is generally square.

* * * * *